(12) United States Patent
Seto et al.

(10) Patent No.: US 7,042,065 B2
(45) Date of Patent: May 9, 2006

(54) SEMICONDUCTOR DEVICE AND METHOD OF MANUFACTURING THE SAME

(75) Inventors: Masami Seto, Hyogo-ken (JP); Kikuo Saka, Hyogo-ken (JP)

(73) Assignee: Ricoh Company, Ltd., Tokyo (JP)

(*) Notice: Subject to any disclaimer, the term of this patent is extended or adjusted under 35 U.S.C. 154(b) by 0 days.

(21) Appl. No.: 10/789,980

(22) Filed: Mar. 2, 2004

(65) Prior Publication Data
US 2004/0183155 A1  Sep. 23, 2004

(30) Foreign Application Priority Data
Mar. 5, 2003  (JP) .............................. 2003-059149

(51) Int. Cl.
*H01L 29/00* (2006.01)
(52) U.S. Cl. ............................... 257/529; 257/E23.149
(58) Field of Classification Search ................ 257/529, 257/758
See application file for complete search history.

(56) References Cited

U.S. PATENT DOCUMENTS 6,638,863 B1* 10/2003 Wang et al. ................ 438/690
2001/0045645 A1* 11/2001 Sasaki et al. ............... 257/725
2002/0025603 A1*  2/2002 Ondricek et al. ........... 438/117
2003/0085445 A1*  5/2003 Watanabe .................... 257/529

FOREIGN PATENT DOCUMENTS

JP            11-135730       5/1999
JP          2000-260910       9/2000

* cited by examiner

*Primary Examiner*—Tu-Tu Ho
(74) *Attorney, Agent, or Firm*—Dickstein Shapiro Morin & Oshinsky LLP

(57) ABSTRACT

A semiconductor device includes a semiconductor substrate, an insulating film, and a fuse element. The semiconductor substrate includes main and back surfaces and a trimming opening penetrating therethrough from the back surface to the main surface. The insulating film is formed on the semiconductor substrate. The fuse element is formed on the main surface of the semiconductor substrate through the insulating film at a position facing the trimming opening. A method of manufacturing a semiconductor device includes the steps of forming a fuse element and forming a trimming opening. The forming step forms the fuse element on a main surface of a semiconductor substrate through an insulating film. The forming step forms the trimming opening from a back surface of the semiconductor substrate to the main surface of the semiconductor substrate at a position facing the fuse element after a formation of the fuse element.

16 Claims, 22 Drawing Sheets

SEMICONDUCTOR DEVICE AND METHOD OF MANUFACTURING THE SAME

This patent specification is based on Japanese patent application No. 2003-059149 filed on Mar. 5, 2003 in the Japanese Patent Office, which is hereby incorporated by reference in its entirety.

1. Field of the Invention

The present invention relates to a semiconductor device and a method of manufacturing the same, and more particularly to such a device and a method which include a fuse element through an insulating film formed on a main surface of a semiconductor substrate.

2. Background of the Invention

In semiconductor package fields, various fine structures have been previously known. One such example is a device package referred to as a Ball Grid Array (BGA). The BGA is a type of packaged integrated circuit in which a plurality of solder balls is mounted on a planar surface of a substrate. Another is a fine pitch BGA (Ball Grid Array). The fine pitch BGA is a structure in which a ball pitch of the BGA is further decreased to make a package outline close to a chip size.

Recently, a wafer level CSP (Chip Size Package) has been used for a device package. One exemplary wafer level CSP is described in Japanese Laid-Open Patent Application Publication No. 2000-260910. The wafer level CSP is a CSP which incorporates an array-formed pad before dicing.

Additionally, a semiconductor device including an analog IC (integrated circuit) such as a power source IC uses a polysilicon fuse element for adjusting a value of a resistance. Such fuse element is cut with laser irradiation through a trimming opening in a laser trimming process. One exemplary semiconductor device is described in Japanese Laid-Open Patent Application Publication No. 11-135730. Generally, a trimming opening is formed on an insulating film of a main surface of a semiconductor substrate.

FIG. 1A is a cross-sectional view of a portion of a fuse element in a background wafer level CSP before laser trimming. FIG. 1B is a cross-sectional view of a portion of a fuse element in a background wafer level CSP after laser trimming. FIG. 1C is a cross-sectional view of a portion of a fuse element in a background wafer level CSP after being sealed with a resin. FIG. 2 is a cross-sectional view of a portion of a fuse element and a metal electrode pad in a background wafer level CSP. FIG. 3 is a flowchart illustrating a part of a background wafer level CSP manufacturing process including a laser trimming process. The background wafer level CSP manufacturing process will be described with reference to FIGS. 1A to 3.

An underlying insulating film 3 is formed on a main surface 1a of a semiconductor substrate 1. On the underlying insulating film 3, a polysilicon fuse element 7 and a polysilicon film 5 such as a gate electrode and a resistor are formed. An interlayer insulating film 9 of borophosphosilicate glass (BPSG) is formed over the semiconductor substrate 1. The interlayer insulating film 9 includes a contact hole 11 formed therein, followed by a formation of a first metal wiring layer 13 and a first metal electrode pad 15 of e.g., aluminum (Al) over the interlayer insulating film 9 and in the contact hole 11. Subsequently, a passivation layer is formed on the substrate 1, a bottom layer having phosphosilicate glass (PSG) film 17 and a top layer having silicon nitride (SiN) film 19, which in turn has disposed thereon a polyimide film 21. A trimming opening 85 is formed in the SiN film 19 over the fuse element 7 for laser trimming. The polyimide film 21 formed over the first metal electrode pad 15 has a first pad opening 23 for electrical connection with a metal wiring layer which is formed later. At this time, a thin layer of the insulating film is left on the fuse element 7, e.g., 0.2 μm to 0.6 μm (see FIGS. 1A and Step S21 in FIG. 3).

A wafer is tested through the first metal electrode pad 15 (see Step S22 in FIG. 3). In order to provide a high-precision analog IC, laser trimming is performed, based on the result of the wafer test, to cut the fuse element 7 (see fuse cut process in FIG. 1B and Step S23 in FIG. 3). FIG. 2 shows the fuse element 7 after cutting.

After the laser trimming process, a barrier metal layer of chromium (Cr) (not shown) and a plating electrode layer of copper (Cu) (not shown) are formed over the semiconductor substrate 1 by sputtering. The barrier metal layer is disposed between a first metal wiring layer 13 of Cu and the first metal electrode pad 15 to block Cu and Al. A photoresist pattern is formed over a predetermined region on the plating electrode layer, followed by a formation of a second metal wiring layer 25 of CU and a second metal electrode pad 27 by an electrolytic plating process, which in turn has formed thereon a barrier metal layer 33. The second metal wiring layer 25 and the second metal electrode pad 27 are also referred to as a rerouting layer (see Step S24 in FIG. 3).

After removing the photoresist pattern, the second metal wiring layer 25 and the second metal electrode pad 27 are masked to remove the unwanted plating electrode layer and the barrier metal layer 33 with wet etching. A further polyimide film 29 is disposed over the semiconductor substrate 1 (see polyimide coat process, FIG. 1C, and Step S25 in FIG. 3). A second pad opening 31 is formed over the second metal electrode pad 27 (see ball mounting opening process, Step S26 in FIG. 3). An external connecting terminal 35, e.g., made of solder, is mechanically mounted on the second metal electrode pad 27 using surface mount techniques (SMT) (see ball mount process, FIG. 2 and Step S27 in FIG. 3). Alternatively, after a cream solder is printed by screen printing, the external connecting terminal 35 may be formed by thermal processing.

Following the wafer test, a back surface 1b of the semiconductor substrate 1 is polished (see Step S28 in FIG. 3). The semiconductor substrate 1 is divided into a chip with a scribing process to complete a wafer level CSP (see Step S29 in FIG. 3).

Referring now to FIGS. 4A–4D, a singulation cut of a semiconductor wafer (hereinafter referred to as a wafer) in a background semiconductor device manufacturing method will be described. In the drawings, the wafer is referenced by the same reference numeral 1 as that of the semiconductor substrate of FIGS. 1–2. One exemplary semiconductor device manufacturing method is described in Japanese Laid-Open Patent Application Publication No. 2000-260910.

In step 1, overlying one surface of a wafer 1 is a semiconductor element, on which is disposed a metal wiring layer (not shown) including a metal electrode pad. Over the wafer 1, copper wiring is formed by an electric plating process or the like. The copper wiring is electrically connected to the electrode pad formed on the wafer 1. An ultraviolet cure dicing tape 87 is attached to an opposite surface (i.e., a back surface) to a formation region of the copper wiring of the wafer 1. Subsequently, a trench 89 is formed on the surface of the wafer 1 using a rapidly rotating peripheral blade (i.e., a dicing saw). The trench 89 is formed in a peripheral portion of each individual chip (i.e., semiconductor device). The thickness of the dicing saw used to form the trench 89 is between 35 μm and 150 μm. The width of the trench 89 is made larger than the thickness of the dicing saw by 1 μm to 5 μm. The depth of the trench 89 is set larger than 10 µm, for example. By making the trench 89 deeper than 10 µm, the trench 89 can be formed with a stable width without depending on the shape of a tip of the blade (see FIG. 4A).

In step 2, the surface of the wafer 1 is filled with a resin 91. The filled resin 91 also fills, to some extent, the trench 89. The surface of the resin 91 is polished with a polishing blade until the copper wiring embedded in the resin 91 is exposed. Subsequently, the external connecting terminal 35 made of a solder ball is formed on the exposed wire. A trench 93 is then formed on the resin 91 deposited on the trench 89 with a rapidly rotating dicing saw (see FIG. 4B).

In step 3, the rapidly rotating dicing saw is used to cut the wafer 1 inside the trench 93 down to the dicing tape 87. The resultant wafer 1 is cut into an individual chip 95. The dicing saw used in this process has a thickness smaller than the dicing saw used in forming the trench 93. This causes trench 94 to be narrower than the trench 93 (see FIG. 4C).

In step 4, after ultraviolet light is irradiated to cure the dicing tape 87, the individual chip 95 is pushed up with a pickup needle 49 to remove it (see FIG. 4D).

All existing techniques, however, possess their own distinct disadvantages.

In a semiconductor manufacturing method using the dicing saw to cut the chip from the wafer, dicing makes a back surface of the semiconductor device 1 chipped and cracked, decreasing deflective stress. In addition, in the wafer level CSP, since a back surface of a chip is imprinted and then the back surface of the chip is at a front surface during a mounting process, chipping affects an appearance of the chip, as illustrated in FIGS. 5A and 5B.

In an analog IC, a resistance is adjusted by cutting a fuse element. Trimming prior to assembly completion alters the resistance after assembly completion due to changes in film stress, thereby decreasing accuracy of electrical characteristics. In the wafer level CSP manufacturing method, trimming is performed after an assembly process to meet the customers' requirements. This increases the time from receipt of orders to delivery.

SUMMARY OF THE INVENTION

In one embodiment, a novel semiconductor device includes a semiconductor substrate, an insulating film, and a fuse element. The semiconductor substrate includes main and back surfaces and a trimming opening that penetrates therethrough from the back surface to the main surface. The insulating film is formed on the semiconductor substrate. The fuse element is formed on the main surface of the semiconductor substrate through the insulating film at a position facing the trimming opening. The insulating film may remain between the fuse element and the trimming opening until a process of cutting the fuse element is performed. The trimming opening may be sealed from the back surface of the semiconductor substrate. The semiconductor device may have a contour with a plurality of corner edges which are rounded. One of the plurality of corner edges may have a curvature greater than those of others. The contour of the semiconductor device may have a side surface on which predetermined pits and dents representing a bar code are formed. The back surface of the semiconductor substrate may include at least one recess-shaped marking formed thereon. The back surface of the semiconductor substrate may include a marking formed thereon by laser irradiation.

Further, in one embodiment, a novel semiconductor device includes a semiconductor substrate, an insulating film, a plurality of fuse elements, a plurality of resistors, and a resistor divider circuit. The semiconductor substrate includes main and back surfaces and a trimming opening that penetrates therethrough from the back surface to the main surface. The insulating film is formed on the semiconductor substrate. The plurality of fuse elements is formed on the main surface of the semiconductor substrate through the insulating film. The resistor divider circuit is configured to connect the plurality of fuse elements and the plurality of resistors and to output a voltage according to a resistor value determined by a number of fuse elements cut by a process of cutting the plurality of fuse elements.

Further, in one embodiment, a novel semiconductor device includes a semiconductor substrate, an insulating film, and a voltage detecting circuit. The semiconductor substrate includes main and back surfaces and a trimming opening that penetrates therethrough from the back surface to the main surface. The insulating film is formed on the semiconductor substrate. The voltage detecting circuit includes a plurality of fuse elements, a plurality of resistors, a resistor divider circuit, a reference voltage generating circuit, and a comparator circuit. The plurality of fuse elements is formed on the main surface of the semiconductor substrate through the insulating film. The resistor divider circuit is configured to divide an input voltage, supply a divided voltage, and connect the plurality of fuse elements and the plurality of resistors and to output a voltage according to a resistor value determined by a number of fuse elements cut by a process of cutting the plurality of fuse elements. The reference voltage generating circuit is configured to supply a reference voltage. The comparator circuit is configured to compare the voltage divided by the resistor divider circuit with the voltage generated by the reference voltage generating circuit.

Further, in one embodiment, a novel semiconductor device includes a semiconductor substrate, an insulating film, and a constant voltage circuit. The semiconductor substrate includes main and back surfaces and a trimming opening that penetrates therethrough from the back surface to the main surface. The insulating film is formed on the semiconductor substrate. The constant voltage circuit includes a plurality of fuse elements, an output driver, a plurality of resistors, a resistor divider circuit, a reference voltage generating circuit, and a comparator circuit. The plurality of fuse elements is formed on the main surface of the semiconductor substrate through the insulating film. The output driver is configured to control an output of an input voltage. The resistor divider circuit is configured to divide an output voltage, supply a divided output voltage, divide an input voltage, supply a divided input voltage, and connect the plurality of fuse elements and the plurality of resistors and to output a voltage according to a resistor value determined by a number of fuse elements cut by a process of cutting the plurality of fuse elements. The reference voltage generating circuit is configured to supply the reference voltage. The comparator circuit is configured to compare the voltage divided by the resistor divider circuit with the voltage generated by the reference voltage generating circuit and control an operation of the output driver based on the comparison result.

Further, in one embodiment, a novel method of manufacturing a semiconductor device includes the steps of forming a fuse element and forming a trimming opening. The forming step forms the fuse element on a main surface of a semiconductor substrate through an insulating film. The forming step forms the trimming opening from a back surface of the semiconductor substrate to the main surface of the semiconductor substrate at a position facing the fuse element after a formation of the fuse element.

The trimming opening may be formed by anisotropic etching.

The insulating film may be used as an etch stop layer.

The semiconductor substrate may be cut to form an individual chip simultaneously with a formation of the trimming opening.

The above-mentioned method may further include the steps of attaching and polishing. The attaching step attaches a tape material on the main surface of the semiconductor substrate. The polishing step polishes the back surface of the semiconductor substrate. The forming step of the trimming opening may form the trimming opening with the tape material attached to the semiconductor material.

The above-mentioned method may further include the steps of marking on the back surface of the semiconductor substrate by laser irradiation when laser marking is performed on the fuse element through the trimming opening.

The above-mentioned method may further include the step of sealing the trimming opening.

The sealing step may seal the trimming opening with a resin material.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, in which.

DETAILED DESCRIPTION OF PREFERRED EMBODIMENTS

Figure 1A:
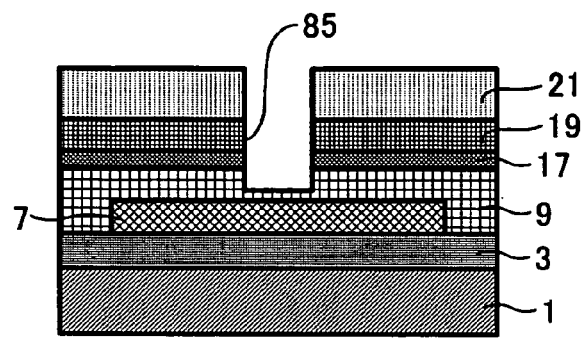
FIG. 1A is a cross-sectional view of a portion of a fuse element in a background wafer level CSP before laser trimming.
Figure 1B:
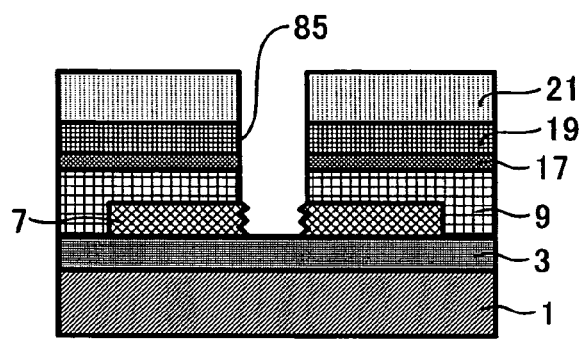
FIG. 1B is a cross-sectional view of a portion of a fuse element in a background wafer level CSP after laser trimming.
Figure 1C:
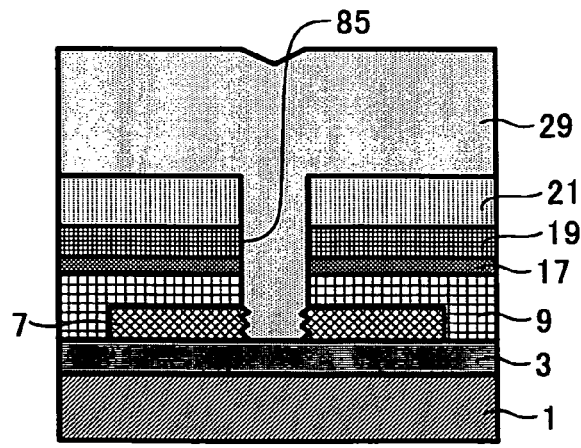
FIG. 1C is a cross-sectional view of a portion of a fuse element in a background wafer level CSP after being sealed with a resin.
Figure 2:
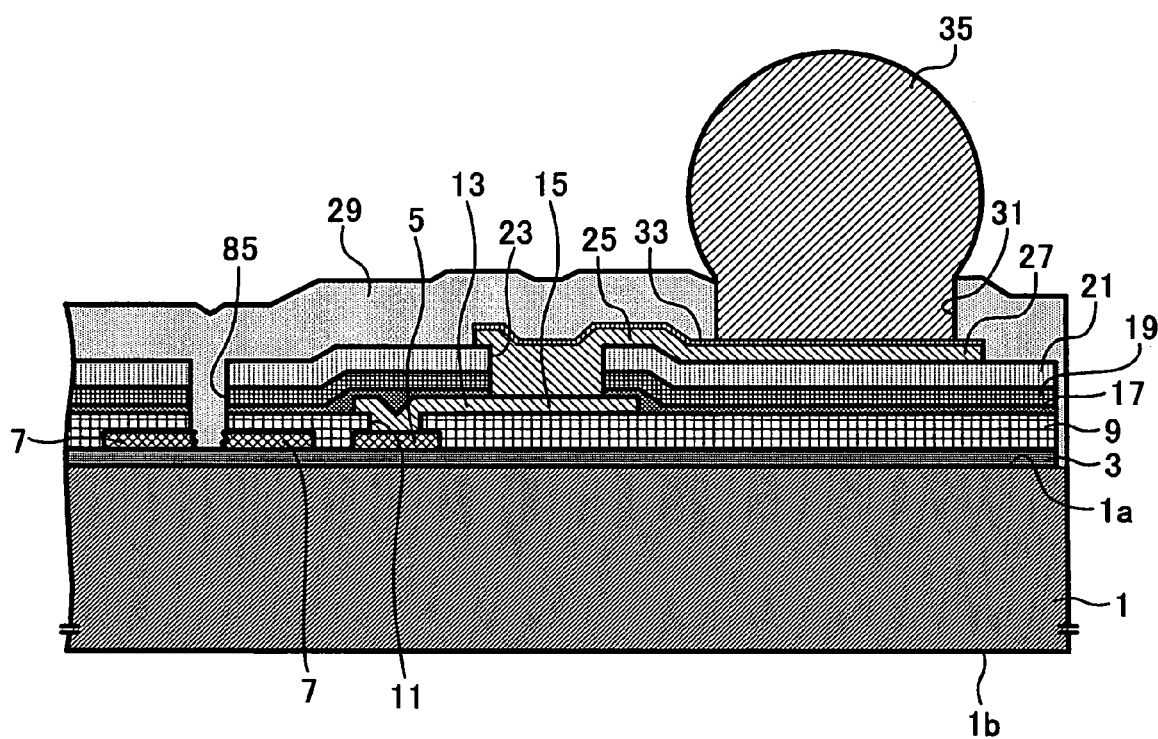
FIG. 2 is a cross-sectional view of a portion of a fuse element and a metal electrode pad in a background wafer level CSP.
Figure 3:
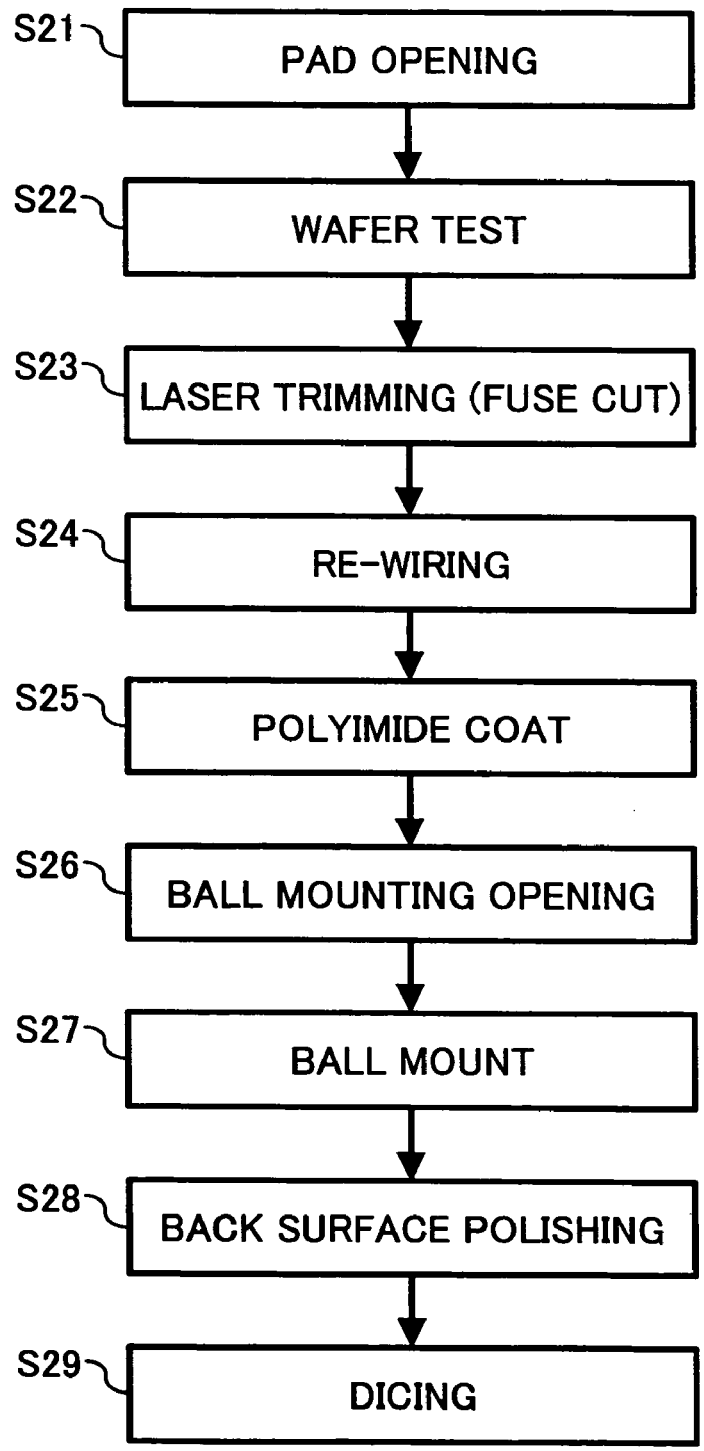
FIG. 3 is a flowchart illustrating a part of a background wafer level CSP manufacturing process including a laser trimming process.
Figure 4A:
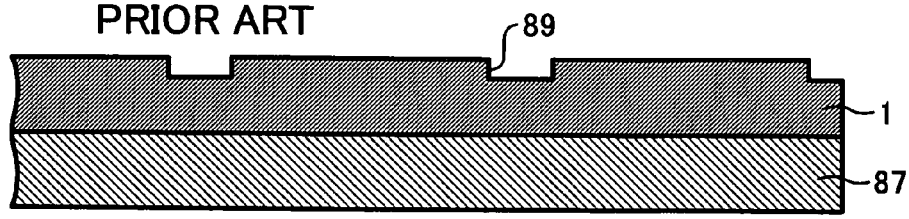
FIG. 4 is a cross-sectional view of an exemplary background semiconductor manufacturing process.
Figure 4B:
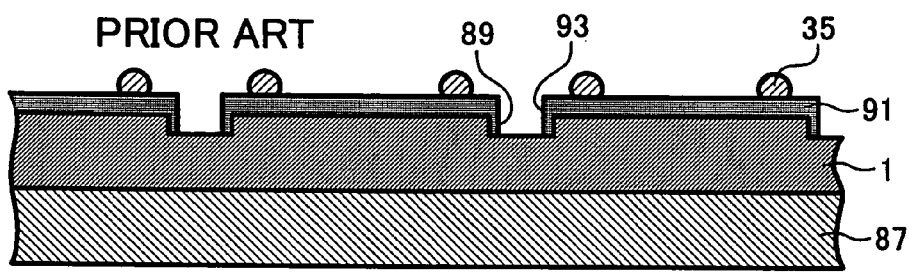
Figure 4C:
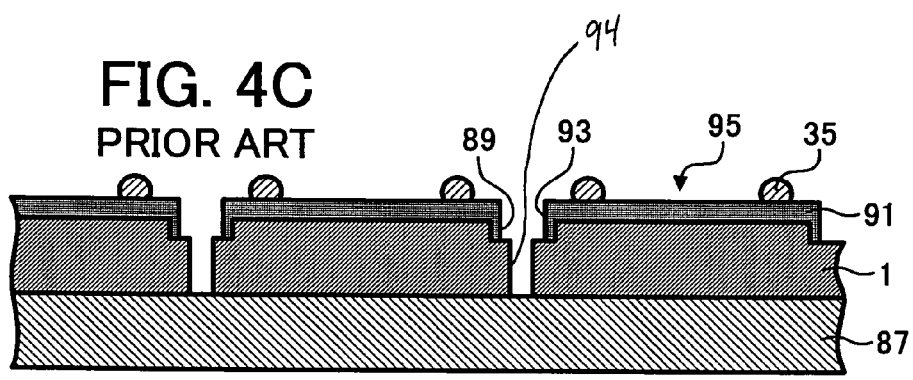
Figure 4D:
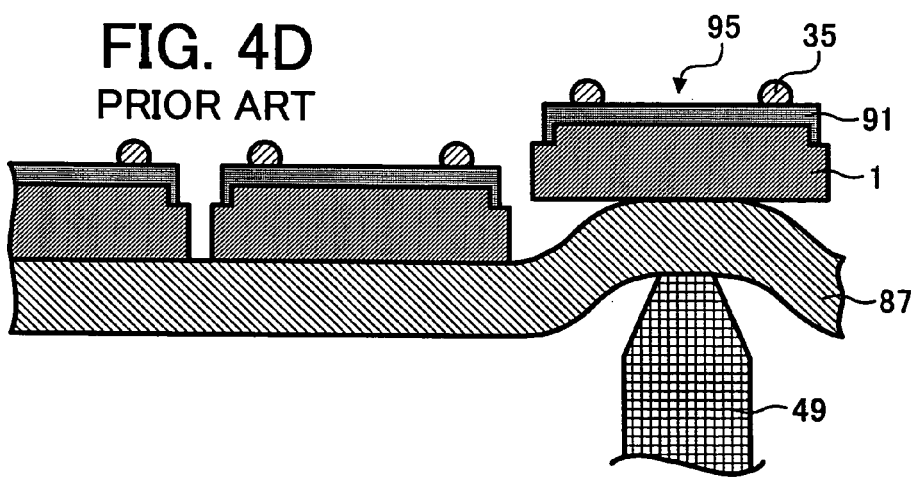
Figure 5A:
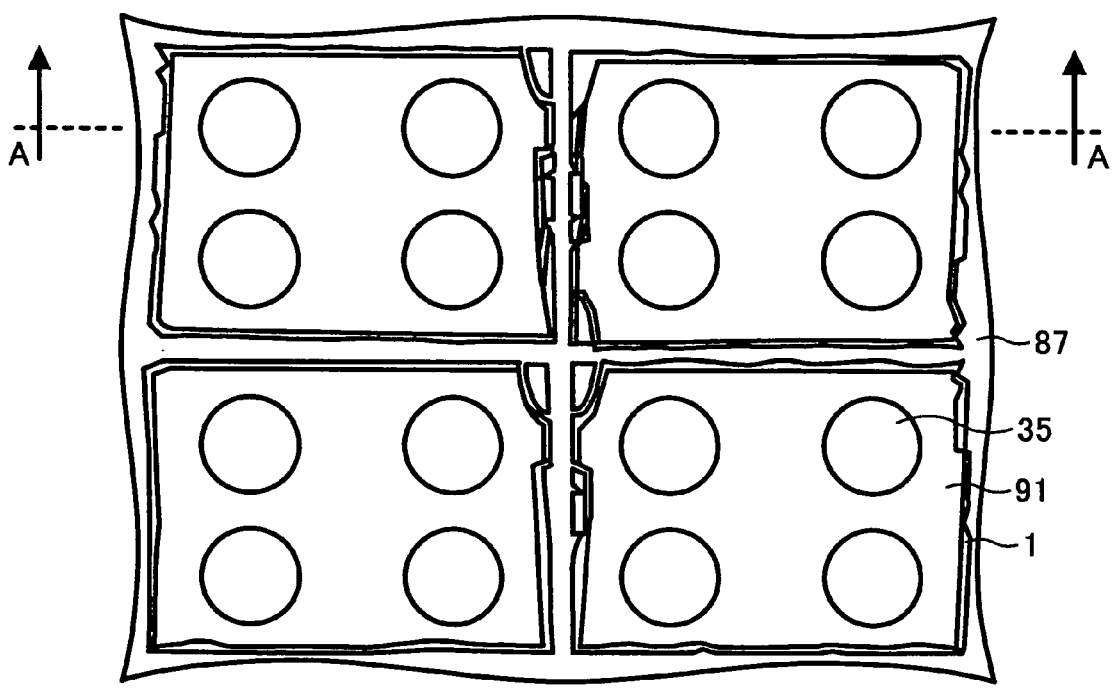
FIG. 5A is a plan view of a failure in a background semiconductor device manufacturing process.
Figure 5B:
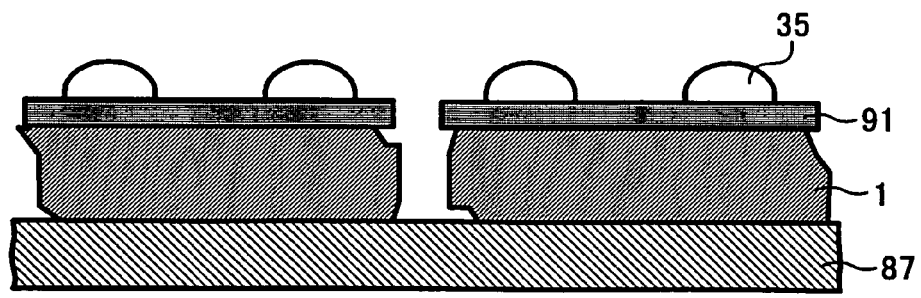
FIG. 5B is a sectional view taken along line A—A of FIG. 5A.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner. Referring now to the drawings, wherein like reference numerals designate identical or corresponding parts throughout the several views, and particularly to FIGS. 6A and 6B, an exemplary semiconductor device according to a preferred embodiment of the present invention is now described.

Figure 6A:
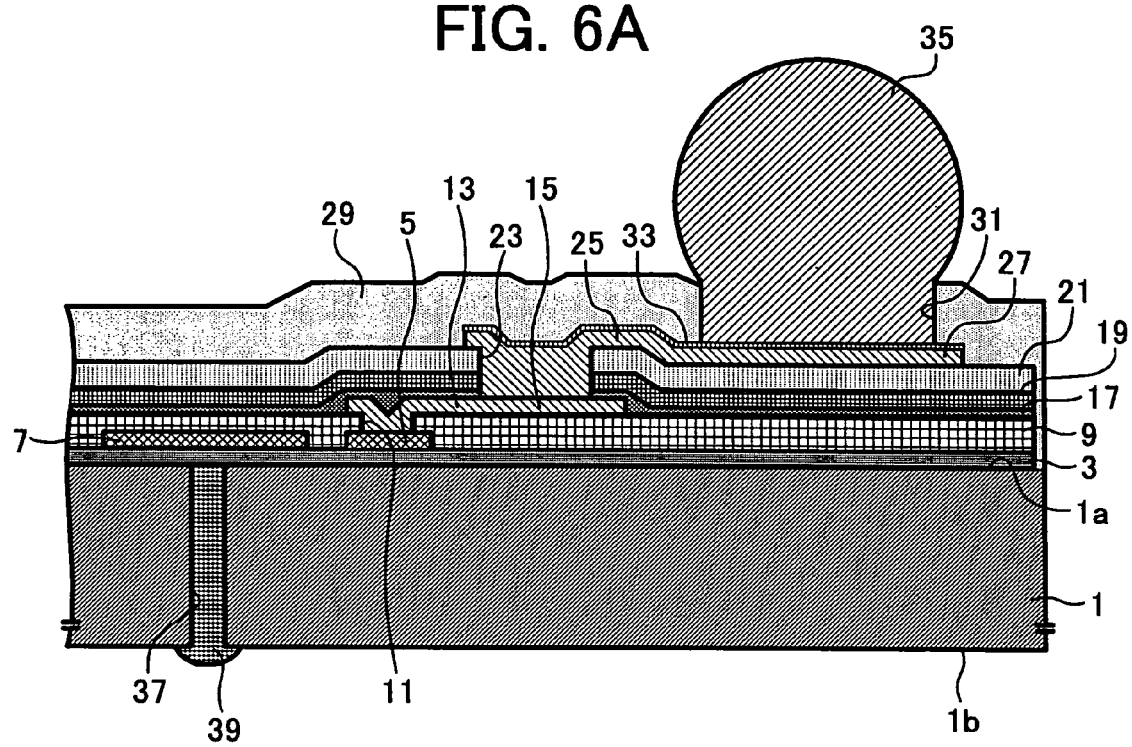
FIG. 6A is a cross-sectional view of a semiconductor device according to a preferred embodiment of the present invention, in which a fuse element is shown before cutting and before a metal electrode pad is formed.
Figure 6B:
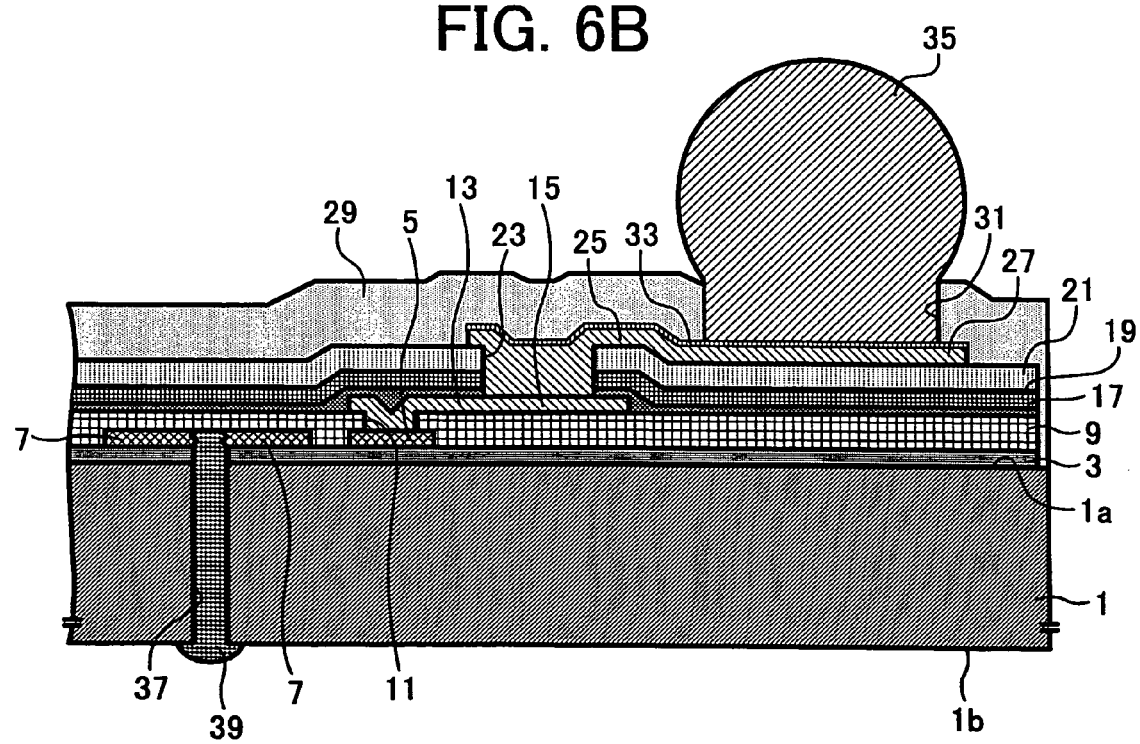
FIG. 6B is a cross-sectional view of the semiconductor device shown in FIG. 6A.

FIG. 6A is a cross-sectional view of a semiconductor device according to a preferred embodiment of the present invention, in which a fuse element 7 is shown before cutting, and before a metal electrode pad 15 is formed. FIG. 6B is a cross-sectional view of the semiconductor device shown in FIG. 6A.

An underlying insulating film 3 of silicon oxide film is disposed on a semiconductor substrate 1, e.g., made of silicon. An allowable thickness range of the underlying insulating film 3 is from approximately 0.5 µm to approximately 0.8 µm. A polysilicon film 5 such as a gate electrode and a resistor, and the fuse element 7 made of polysilicon are disposed on the underlying insulating film 3. An interlayer insulating film 9 made of BPSG is disposed over the semiconductor substrate 1 including a formation region of the polysilicon film 5 and the fuse element 7. The interlayer insulating film 9 includes a contact hole 11 corresponding to the polysilicon film 5 and another contact hole (not shown) corresponding to the fuse element 7 formed thereon.

A first metal wiring layer 13 and a first metal electrode pad 15 are disposed on the interlayer insulating film 9 and in the contact hole 11. The first metal wiring layer 13 and the first metal electrode pad 15 are composed of, for example, an Al—Si alloy (Si: 1 weight percent (w %)). In FIG. 6B, the fuse element 7 is cut. Although FIGS. 6A and 6B show only a single fuse element 7, a plurality of fuse elements 7 is formed on other regions of the semiconductor substrate 1.

A passivation layer, including a PSG film 17 and a silicon nitride (SiN) film 19, is formed over the interlayer insulating film 9. The PSG film 17 has a thickness of approximately 0.4 µm on a bottom layer of the passivation layer. The SiN film 19 has a thickness of approximately 1.2 µm on a top layer of the passivation layer. A polyimide film 21 having a thickness of approximately 5.3 µm is disposed on the passivation layer. Alternatively, films other than the polyimide film 29 may be used, e.g., polybenzoxazole, "SUMIRESIN ®RC8300" manufactured by Sumitomo Bakelite Company, Limited.

The PSG film 17, the SiN film 19, and the polyimide film 21 include a first pad opening 23 corresponding to the first metal electrode pad 15.

A second metal wiring layer 25 and a second metal electrode pad 27 are disposed on the polyimide film 21 and in the first pad opening 23. The second metal wiring layer 25 and the second metal electrode pad 27 are composed of, for example, an Al—Si alloy (Si: 1 w %). A barrier metal layer 33 is formed on the second metal wiring layer 25 and the second metal electrode pad 27. The barrier metal layer 33 includes a Ti layer having a thickness of 0.1 µm, an Ni layer of 0.4 µm, and an Ag layer of 0.1 µm from bottom to top layers.

An additional polyimide film 29 is disposed on the polyimide film 21 and the second metal wiring layer 25. The polyimide film 29 has a thickness of 25 µm, for example. The polyimide film 29 forms a final overcoat.

Alternatively, films other than the polyimide film 29 may be used, e.g., polybenzoxazole, "SUMIRESIN ®CRC8300" manufactured by Sumitomo Bakelite Company, Limited.

The polyimide film 29 includes a second pad opening 31 formed therein corresponding to the second metal electrode pad 27. The external connecting terminal 35, e.g., made of solder, is disposed on the second metal electrode pad 27 through the barrier metal layer 33. The external connecting terminal 35 has its end portion extending from a surface of the polyimide film 29.

A trimming opening 37 is formed in the semiconductor substrate 1. The trimming opening 37 extends from a back surface 1b through a main surface 1a to a formation region of the fuse element 7.

The underlying insulating film 3 remains between a bottom of a trimming opening 37 and the fuse element 7 until a process of cutting the fuse element is performed (see FIG. 6A). A typical process for forming a trimming opening includes anisotropic etching. After the cutting of the fuse element 7, the fuse element 7 has no underlying insulating film 3 thereunder (see FIG. 6B).

A sealing resin 39 is filled into the trimming opening 37. Materials of the sealing resin 39 include epoxy resin (e.g., CEL-C-3140 manufactured by Hitachi Chemical Co., Ltd).

Figure 7:
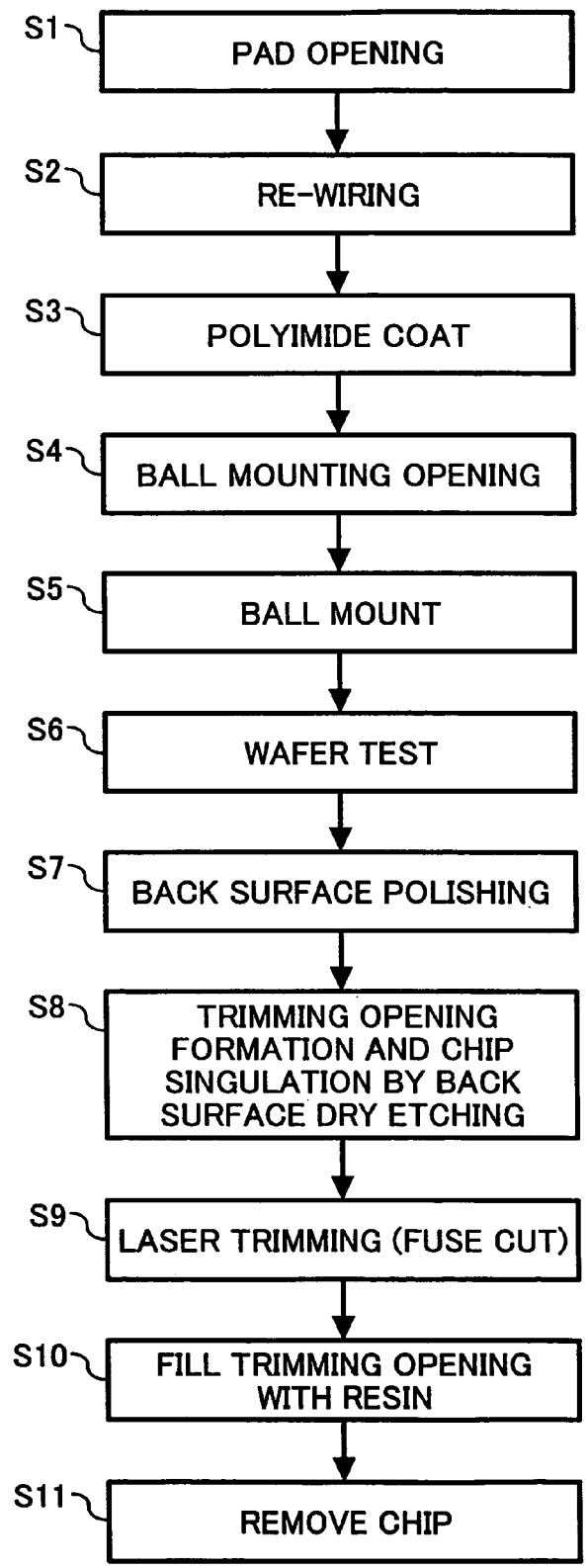
FIG. 7 is a flowchart of a semiconductor device manufacturing method according to an exemplary embodiment of the present invention.

FIG. 7 is a flowchart of a semiconductor device manufacturing method according to an exemplary embodiment of the present invention.

FIGS. 8A–8M are cross-sectional views of semiconductor device manufacturing processes included in the semiconductor device manufacturing method of FIG. 7. In the drawings, a wafer is referenced by the same reference numeral 1 as that of the semiconductor substrate described above.

In step 1, the underlying insulating film 3 is formed on a main surface 1a of a wafer 1 made of silicon. On the underlying insulating film 3, the polysilicon film 5 and the fuse element 7 are formed. The BPSG film of the interlayer insulating film 9 is disposed on the underlying insulating film 3. The contact hole 11 is formed in the interlayer insulating film 9. The interlayer insulating film 9 and the underlying insulating film 3 over a division region for separating the wafer 1 into a chip are separately removed.

An Al—Si alloy (Si: 1 w %) is deposited, e.g., to a thickness of 3 µm, over the wafer 1 by sputtering to form a metal material layer. The metal material layer is patterned by photolithography and etching techniques to form the first metal wiring layer 13 and the first metal electrode pad 15.

A PSG film 17, e.g., having a thickness of 0.4 µm, is deposited over the wafer 1 by chemical vapor deposition (CVD) techniques, which in turn has disposed thereon a SiN film 19 having a thickness of 1.2 µm to form a passivation layer. In addition, a positive photosensitive polyimide film is spincoated on the passivation layer to form a 5.3 µm thick coating. An opening is formed in a positive photosensitive polyimide material layer by exposure and development correspond to the first metal electrode pad 15 and an isolation region. Subsequently, polyimide is cured at 320° C. to form polyimide film 21.

The polyimide film 21 is masked to etch the SiN film 19 and the PSG film 17 and form the PSG film 17, the SiN film 19, and the polyimide film 21 over the first metal electrode pad 15. Then, the PSG film 17 and the SiN film 19 which are the isolation region are removed (see Step S1 in FIG. 7 and FIG. 8A).

In step 2, the second metal wiring layer 25 and the second metal electrode pad 27 are formed on the polyimide film 21 and in the first pad opening 23. The barrier metal layer 33 is formed over the second metal wiring layer 25 and the second metal electrode pad 27 (see Step S2 in FIG. 7 and FIG. 8B).

Some examples of cover materials of the second metal wiring layer 25 and the second metal electrode pad 27 include an aluminum alloy layer such as Al—Si alloy (Si: 1 w %), Al—Si—Cu alloy (Si: 1 w %, Cu: 0.5 w %), Al—Cu (Cu: 1 w %), Al—Cu (Cu: 2 w %) and copper.

When Al—Si alloy (Si: 1 w %) is used for the second metal wiring layer 25 and the second metal electrode pad 27, an aluminum alloy layer of Al—Si alloy (Si: 1 w %) having a thickness of 3 µm is formed by sputtering. Disposed on the aluminum alloy layer is the barrier metal layer 33 by sputtering or evaporation techniques. The barrier metal layer 33 is made of a Ti layer having a thickness of 0.1 µm, an Ni layer of 0.4 µm, and an Ag layer of 0.1 µm. A resist pattern in correspondence to interconnection patterns is formed by resist application, exposure, and development with photo-engraving processes. The barrier metal layer 33 is selectively removed by wet etching, followed by selective removal of the aluminum alloy layer by dry etching to form the second metal wiring layer 25 and the second metal electrode pad 27. Subsequent to the etching, the resist pattern is removed by plasma asher. The barrier metal layer 33 may be other metal materials such as three layers including a Ti layer, an Ni layer, and an Au layer, or an Ni layer, a Pd layer, and an Au layer.

When copper is used for materials of the second metal wiring layer 25 and the second metal electrode pad 27, chromium having a thickness of 0.1 µm and copper having a thickness of 0.5 µm are formed by sputtering. This prevents copper migration and improves adhesive strength. A resist pattern in correspondence to interconnection patterns is formed by resist application, exposure, and development with photo-engraving processes. Copper wiring having a thickness of 5 µm is formed by an electrolytic plating process, which in turn has disposed thereon layers of 3 µm thick nickel, 0.5 µm thick palladium, and 1 µm thick gold from bottom to top to form the barrier metal layer 33. After removal of the resist pattern by asher, the portions of chromium and copper where copper wirings are not formed thereover are removed by wet etching to complete the second metal wiring layer 25 and the second metal electrode pad 27.

In step 3, a negative photosensitive polyimide film having a thickness of 25 µm is applied by spin coating, for example (see Step S3 in FIG. 7)

In step 4, in correspondence to a second pad opening formation region and an isolation region, exposure is performed using a reticle having a light shielding portion to irradiate the negative photosensitive polyimide film other than the second pad formation region and the isolation region. The second pad opening 31 is formed by development process in the negative photosensitive polyimide film in correspondence to a formation region of the second metal electrode pad 27 to remove the negative photosensitive polyimide film which is an isolation layer. Thereafter, polyimide is cured at 320° C. to form a polyimide film 29 (see Step S4 in FIG. 7 and FIG. 8C).

In step 5, after a cream solder having a thickness of 300 µm is printed by screen printing corresponding to a position of the second pad opening 31, the cream solder is heated by heat fusion at 260° C. for 10 seconds in an infrared reflow furnace to form the external connecting terminal 35. Subsequently, flux used by the screen printing is rinsed with a washing liquid before drying (see Step S5 in FIG. 7 and FIG. 8D).

Referring to FIGS. 8E–8M, subsequent steps are now described. In FIGS. 8E–8M, the insulating film and the metal wiring layers formed in the above-mentioned steps 1 to 5 are not shown in the drawings for the sake of simplicity. The insulating layers and the metal wiring layers are integrated illustratively as the wafer 1. The opening 31 formed in the polyimide film 29 corresponding to the isolation region also is not shown.

In step 6, a wafer test is conducted by connecting the external contact terminal 35 to a test pin 36. This test determines fuse elements to cut on each chip for storing each chip's data (see Step S6 in FIG. 7 and FIG. 8E).

In step 7, a surface protection tape 41 (i.e., a tape material) is attached to the surface 1a of the wafer 1 on which the external contact terminal 35 is formed. The surface protection tape 41 protects the surface 1a of the wafer 1 at the time of grinding. In this case, ultraviolet-curable non-adhesive tape is used for the surface protection tape 41, for example (see FIG. 8F).

Figure 8A:
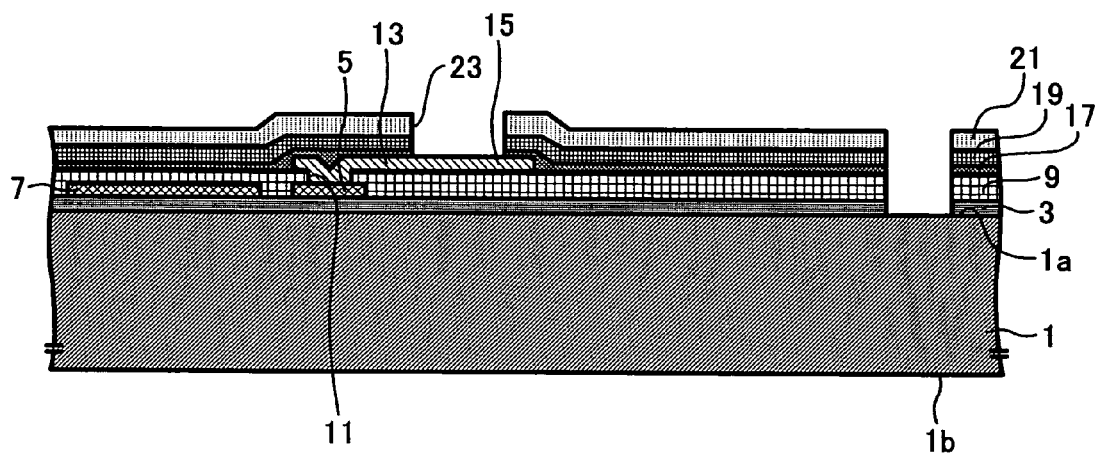
FIGS. 8A–8M are cross-sectional views of semiconductor device manufacturing processes included in the semiconductor device manufacturing method of FIG. 7.
Figure 8B:
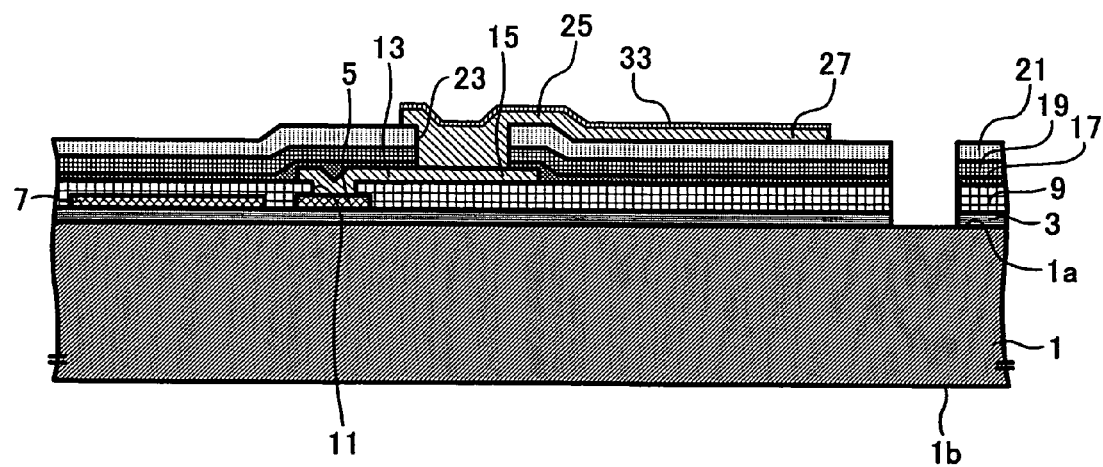
Figure 8C:
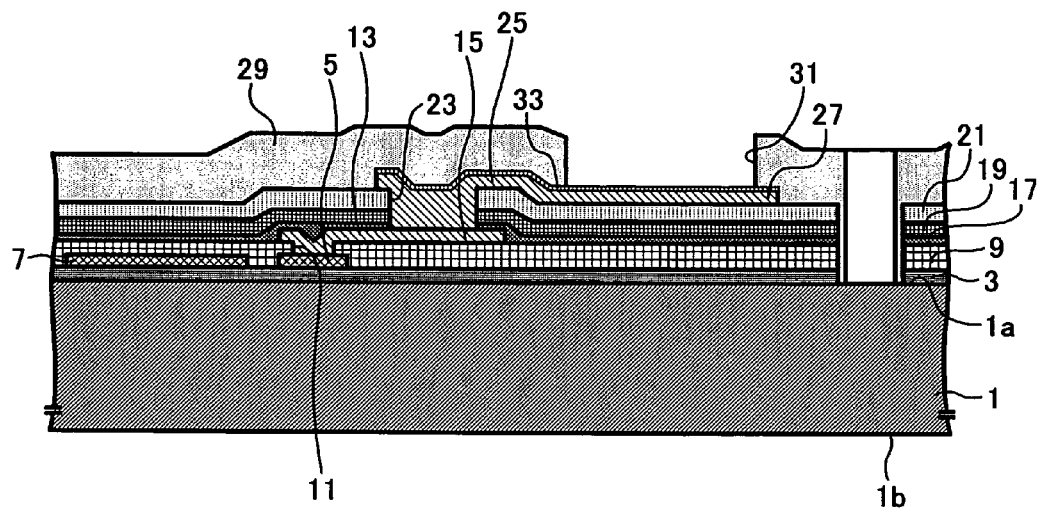
Figure 8D:
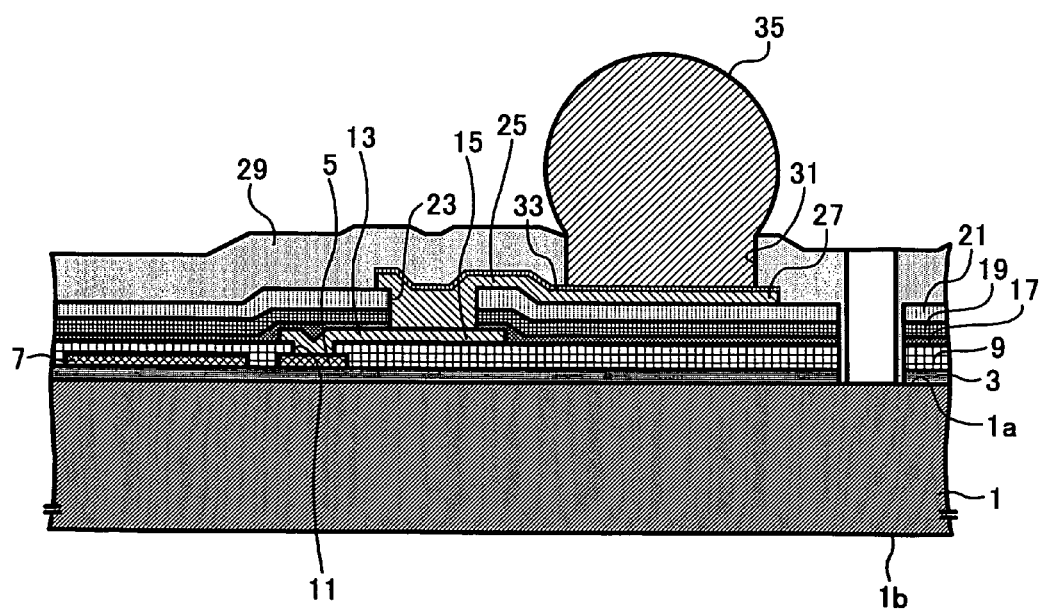
Figure 8E:
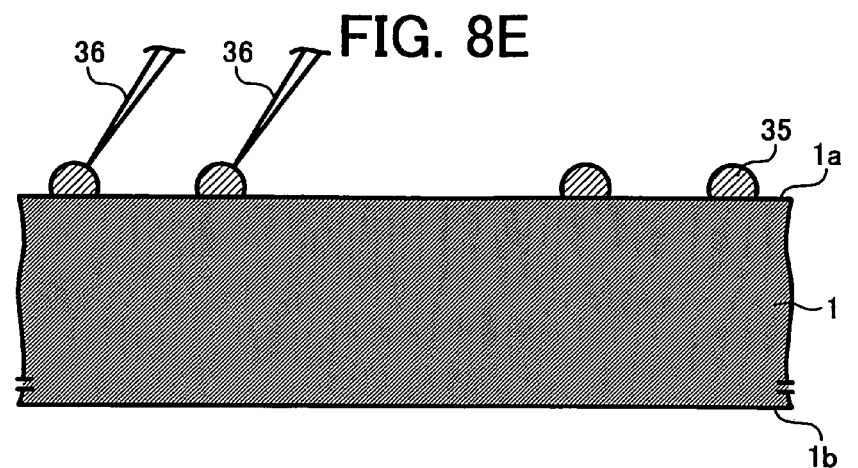
Figure 8F:
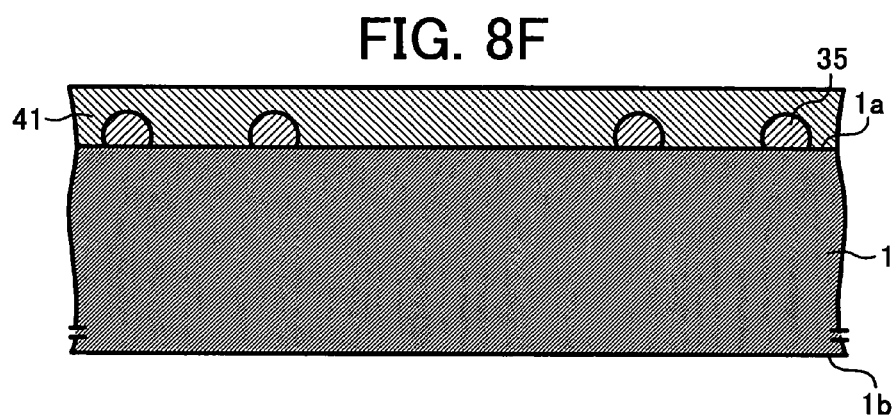
Figure 8G:
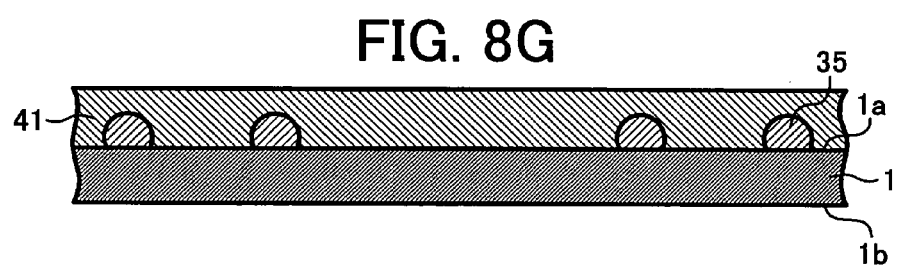

A back surface 1b of the wafer 1 is ground to form the wafer 1 having a thickness of, e.g., 50 µm to 200 µm (see Step S7 in FIG. 7 and FIG. 8G).

Figure 8H:
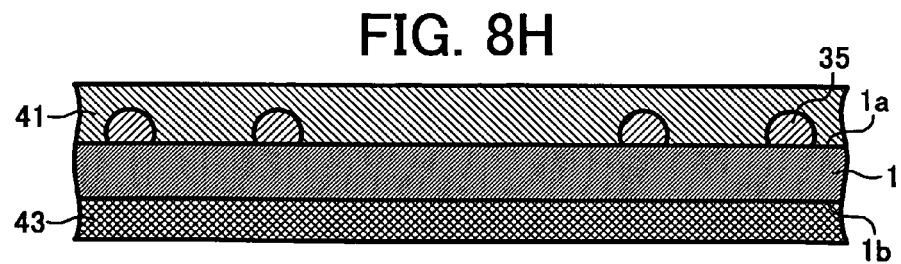
Figure 8I:
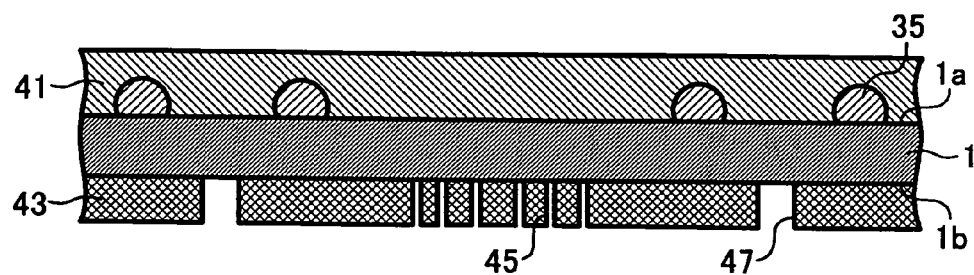

In step 8, after polishing the back surface 1b of the wafer 1, the surface protection tape 41 remains unremoved, followed by spin-coating of a photoresist 43 on the back surface 1b (see FIG. 8H).

Figure 9:
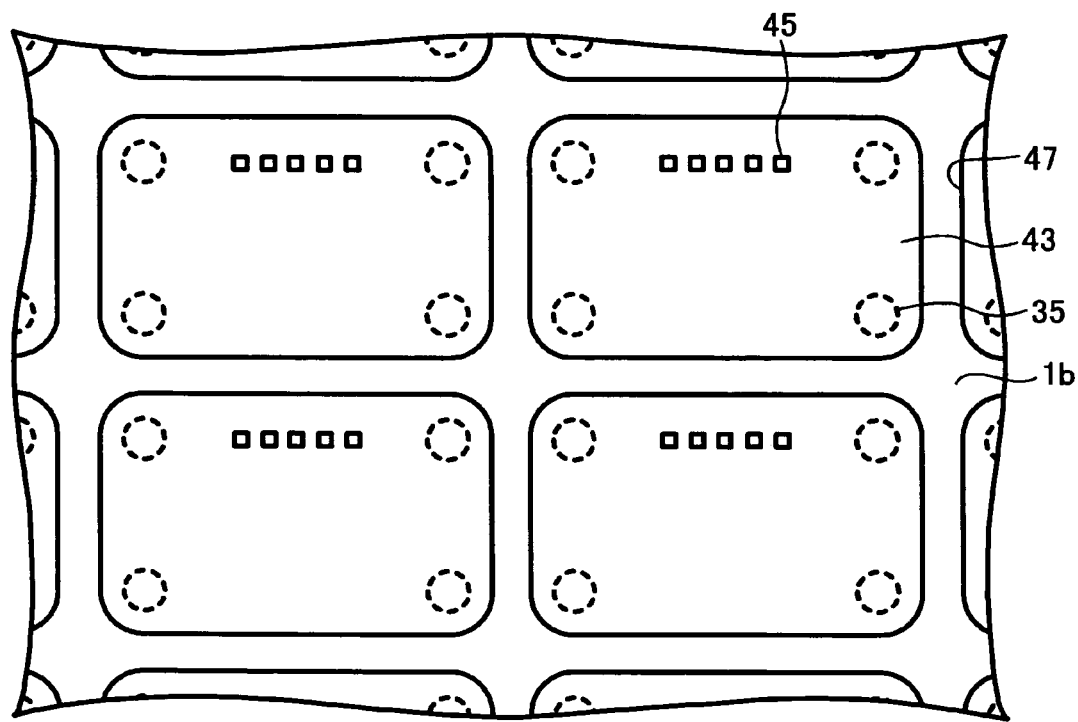
FIG. 9 is a plan view of a photoresist for use in a formation of a trimming opening and an isolation of a wafer in the semiconductor device manufacturing method of FIG. 7.

An IR (infrared) aligner having an IR transparent function or a front-back alignment function by image recognition is used to align a formation region of the trimming opening and the isolation region of the wafer 1 to expose and develop the photoresist 43. As shown in FIG. 7, an opening 45 is formed in the photoresist 43 to the trimming opening formation region and an opening 47 is formed in the photoresist 43 to the isolation region (see FIG. 8I). The opening 45 has a dimension of approximately 5×5 µm, while the opening 47 has a width of approximately 1 µm to 10 µm. The photoresist 43 includes a plurality of corner edges which are rounded in the chip formation region seen from the top thereof (see FIG. 9).

With the surface protection tape 41 remaining unremoved, the back surface 1b of the wafer 1, facing toward a plasma chamber of an Inductive Coupled Plasma (ICP) etcher (i.e., a parallel flat-plate type dry etcher according to an anodic bonding method), is etched with the ICP. In this process, sulfur hexafluoride ($SF_6$) and perfluorocyclobutane ($C_4F_6$) are mixed at a rate of 100 cc to 100 cc to produce reaction gases. The resulting reaction gases are introduced through an inlet of the etcher to maintain the reaction chamber at 2.1 Pascal (Pa). A coil is applied by high-frequency power at 600W for 5.5 seconds, causing physical-chemical reaction between an exposed silicon workpiece and residual radicals and reactive gas ions in plasma to remove silicon from the workpiece of the wafer 1. Then, the $SF_6$ flow is turned off, flowing the $C_4F_6$ at a rate of 190 cc to maintain the reaction room at 1.6 Pa. The coil is applied by high-frequency power at 600W for 5 seconds. A reaction product is deposited on sidewalls of the silicon-removed trench or hole. When the above-mentioned 5.5 and 5 second steps are repeated, the reaction product provides an etch mask, which is used to proceed with anisotropic etching.

In this plasma etching process, the underlying insulating film 3 serves as an etching stopper film in the trimming opening formation region. In the isolation region, the surface protection tape 41 stops the etching. As a result, the trimming opening 37 is formed from a back surface of the semiconductor substrate to the main surface of the semiconductor substrate at a position facing the fuse element 7 to isolate the wafer 1 into each chip 4 (see Step S8 in FIG. 7 and FIG. 8J).

Figure 8J:
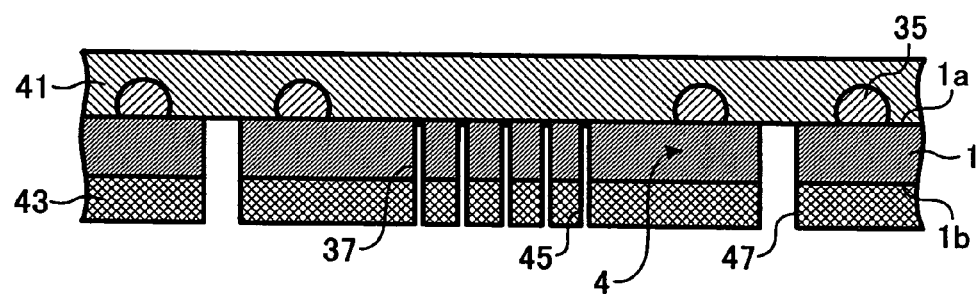
Figure 8K:
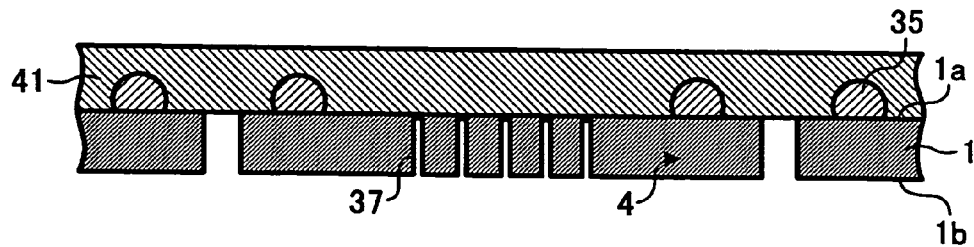
Figure 10:
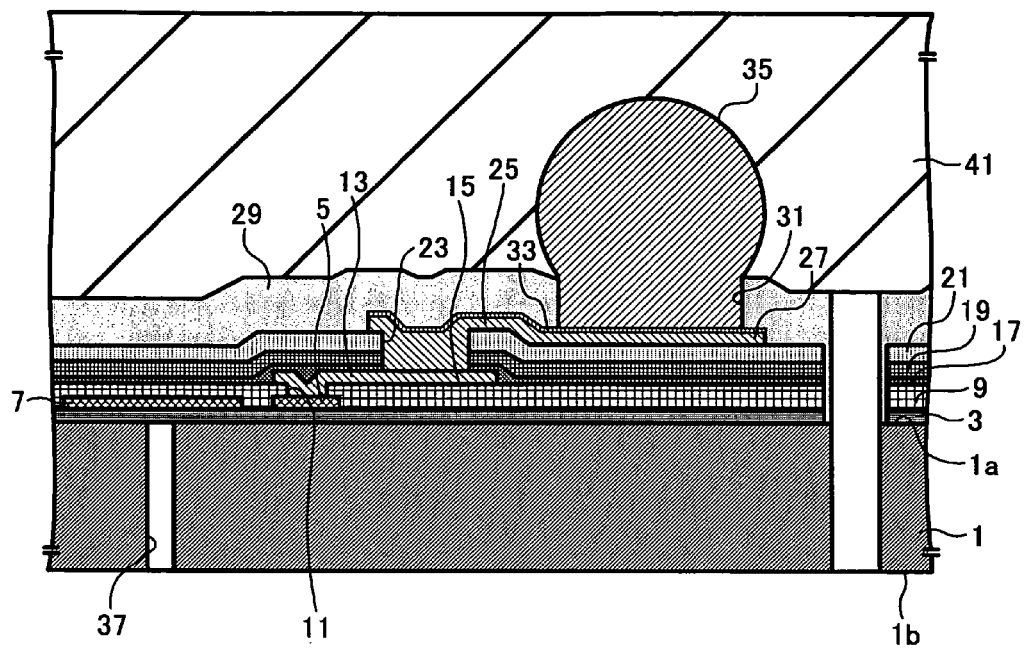
FIG. 10 is an enlarged cross-sectional view illustrating a formation of the trimming opening and an isolation of the wafer into each chip in the semiconductor device manufacturing method of FIG. 7.

The photoresist 43 is removed by the asher (see FIG. 8K). FIG. 10 is an enlarged cross-sectional view illustrating formation of the trimming opening 37 and isolation of the wafer 1 into each chip 4.

Figure 11:
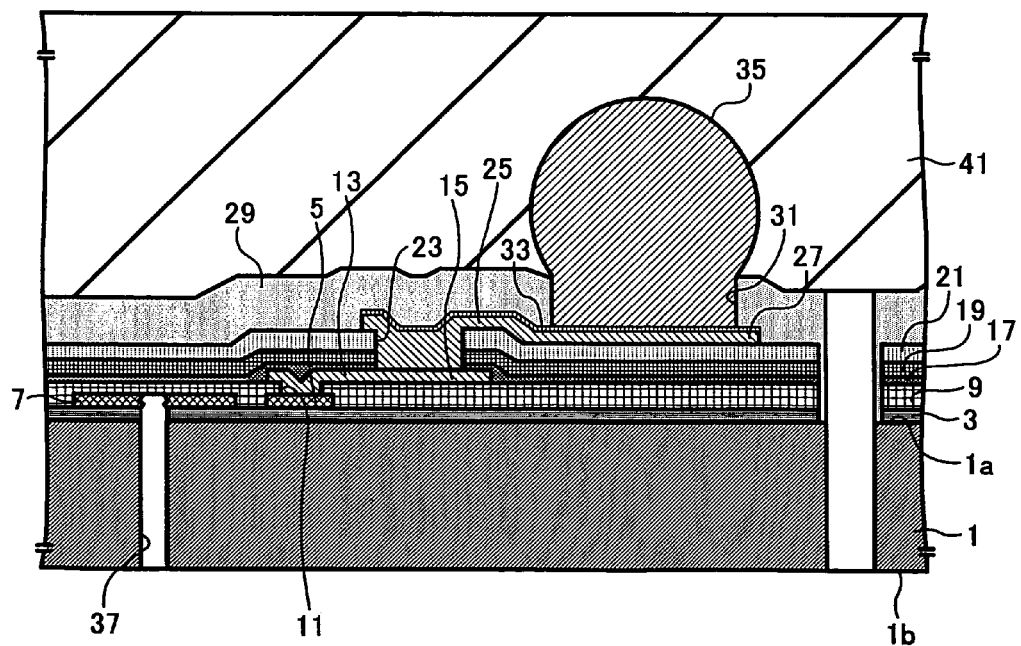
FIG. 11 is an enlarged cross-sectional view illustrating a step of cutting a fuse element in the semiconductor device manufacturing method of FIG. 7.

In step 9, based on the result of the wafer test in step 6, laser light is irradiated using the IR aligner onto a predetermined fuse element to perform a trimming process (see Step S9 in FIG. 7). FIG. 11 is an enlarged cross-sectional view illustrating a step of cutting a fuse element 7. At this time, laser marking is performed on the back surface 1b for identifying a chip. In the laser marking, the IR aligner is used to provide printing (not shown) on the back surface 1b corresponding to each chip formation region.

Figure 8L:
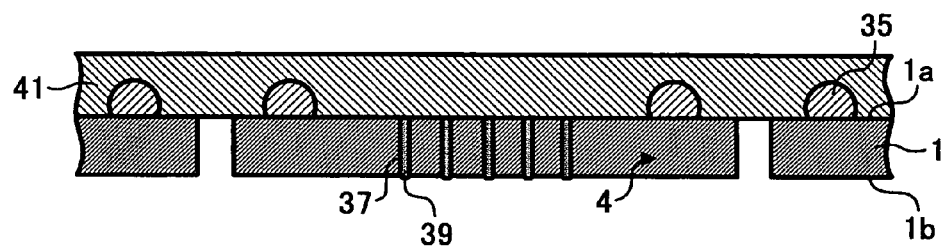
Figure 8M:
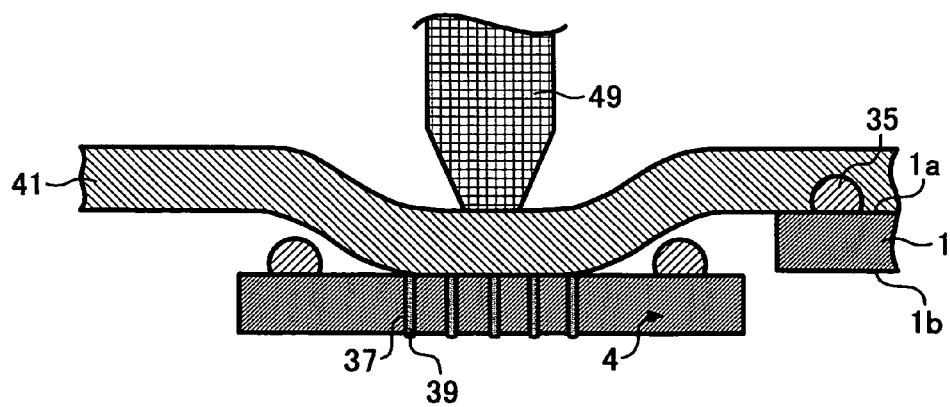

In step 10, after laser trimming, the sealing resin 39 is filled into the trimming opening 37 in the wafer 1 (see Step S10 in FIG. 7 and FIG. 8L).

In FIGS. 6A, 6B, and 8L, the sealing resin 39 is filled up to the bottom of the trimming opening 37 (i.e., at a side of a main surface 1a of a wafer 1). However, it is understood that the invention is not limited in this respect. At least the back surface 1b of the trimming opening 37 is sealed.

In step 11, ultraviolet light is irradiated onto a side of the surface 1a of the wafer 1 with an ultraviolet radiation device to decrease an adhesion of the surface protection tape 41. The individual chip 4 is pushed with a pickup needle 49 before removing (see Step S11 in FIG. 7 and FIG. 8M).

In this embodiment, the trimming opening 37 is not formed in an insulating film on the main surface of a semiconductor substrate. After the polyimide film 29 (i.e., a final overcoat) is formed (see step 4), that is, after an assembly process is completed, the trimming opening 37 is formed from the back surface 1b of the wafer 1 (see step 8). Performing laser trimming through the trimming opening 37 (see step 9) eliminates the need for a final overcoat process after the trimming process as described in the background of the invention. In an analog IC which adjusts a value of a resistance by cutting a fuse element, resistance value fluctuation is eliminated after trimming, thereby increasing the accuracy of electrical characteristics. When trimming is performed to meet the customers' requirements, the time from receipt of orders to delivery is reduced.

Further, in this embodiment, when the trimming opening 37 is formed in step 8, the underlying insulating film 3 serves as the etch stop layer (see FIG. 7) so that the underlying insulating film 3, disposed between a bottom of the trimming opening 37 and the fuse element 7, remains stable. This precisely stabilizes trimming to multilevel interconnections.

Further, in this embodiment, after the surface protection tape 41 is attached to the surface 1a of the wafer 1 in step 7, the back surface 1b of the wafer 1 is polished. In step 8, the wafer 1 is attached to the surface protection tape 41 to form the trimming opening 37. This structure supports the thin wafer 1 by the surface protection tape 41, leading to easy transport of the wafer 1 and a decreased thickness of the chip 4.

Further, in this embodiment, the wafer 1 is cut to form an individual chip at the same time the trimming opening 37 is formed in step 8 so that the resultant chip 4 is prevented from chipping and crack. Moreover, the elimination of the dicing tape used in the background of the invention results in reducing waste in the production process.

Further, in the background chip singulation cut, chips are vertically and horizontally cut with dicing techniques to form a rectangular shape. In this embodiment, the chip 4 is isolated by etching to process the chip 4 into a predetermined shape.

Figure 12A:
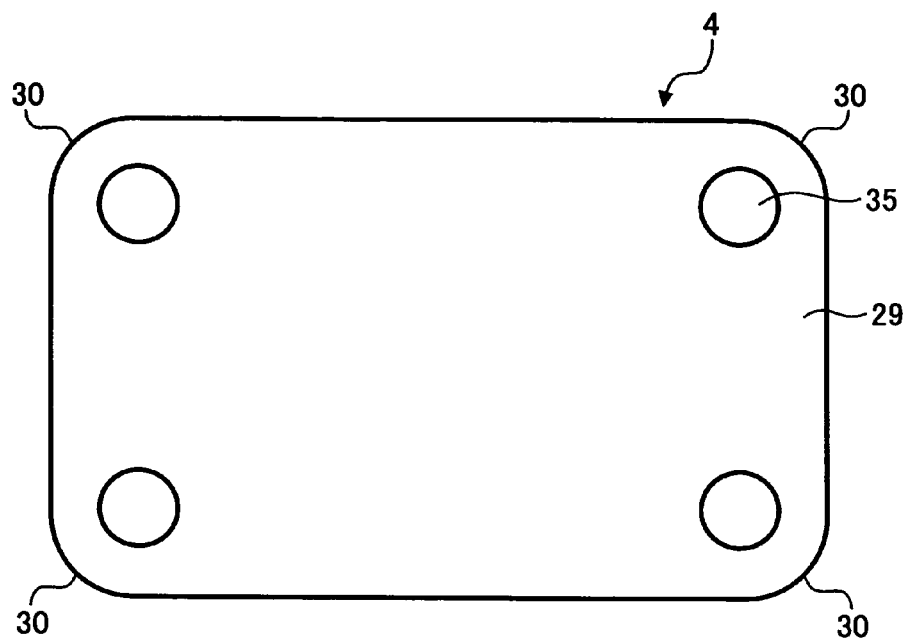
FIG. 12A is a plan view illustrating a step of removing a chip, and showing an upper surface of a semiconductor substrate.
Figure 12B:
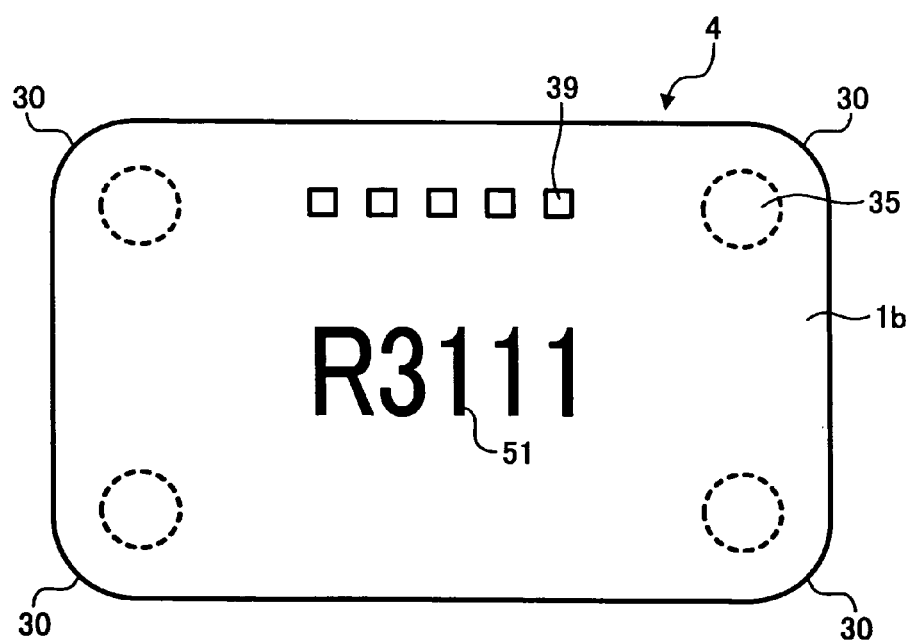
FIG. 12B is a plan view illustrating a step of removing a chip, and showing a lower surface of a semiconductor substrate.

FIG. 12A is a plan view illustrating a step of removing a chip, and showing an upper surface of the semiconductor substrate. FIG. 12B is a plan view illustrating a step of removing a chip, and showing a lower surface of the semiconductor substrate. The semiconductor substrate 1 and the polyimide film 29 include the removed chip 4 having corner edges 30 which are rounded. This reduces cosmetic defects such as chipping and cracking during transportation and provides better efficiency and reliability.

Moreover, the back surface 1b of the chip 4 includes a laser marking 51 imprinted by a laser simultaneously with the laser trimming in step 9 (see FIG. 12B). The laser marking 51 includes information about a manufacturing lot and a type of device, for example. The laser marking 51 is imprinted simultaneously with laser trimming so that a production time is reduced.

Further, in this embodiment, the sealing resin 39 seals the trimming opening 37, preventing electrical short circuits due to foreign object contamination in the fuse element 7 after cutting (see FIG. 6B). In addition, the sealing resin 39 also protects a periphery of the fuse element from corrosion caused by moisture absorption and oxidation. This improves the quality and reliability of the device.

Figure 13A:
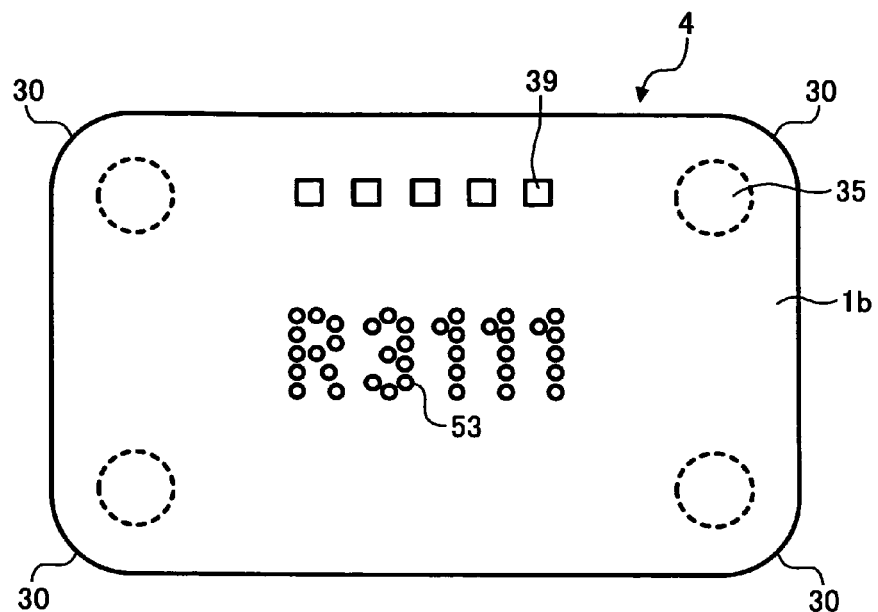
FIG. 13A is a plan view of a semiconductor substrate according to another embodiment of the present invention.
Figure 13B:
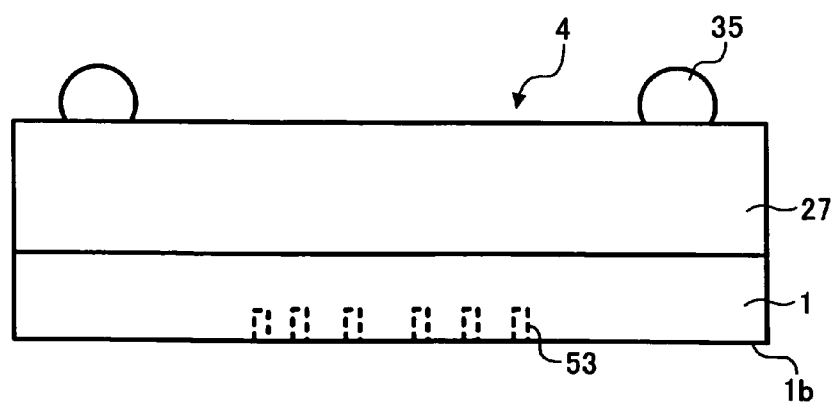
FIG. 13B is a side view of the semiconductor substrate shown in FIG. 13A.

FIG. 13A is a plan view of a semiconductor device according to another embodiment of the present invention. FIG. 13B is a side view of the semiconductor device shown in FIG. 13A. The same reference numerals have been used to identify components which provide the same functions as those in the embodiments of FIGS. 6A–6B and 12A–12B and will not be further explained.

The back surface 1b of the semiconductor substance 1 has a plurality of recess-shaped markings formed by dots 53 on the top thereof.

FIGS. 14A–14D are cross-sectional views illustrating an example of manufacturing processes of a semiconductor device. In this example, the chip shown in FIGS. 13A and 13B is fabricated. Steps 1 to 7 are substantially similar to the processes described with reference to FIGS. 7 to 8A–8M. Thus, the descriptions are omitted. Referring now to step 8, the present embodiment will be described.

In step 8, the wafer 1 including the photoresist 43 formed on the back surface 1b is aligned with a formation region of the trimming opening of the wafer 1 and the isolation region using the IR aligner to expose and develop the photoresist 43. An opening (not shown) is formed in the photoresist 43 to the trimming opening formation region. The opening 47 is formed in the photoresist 43 to the isolation region. Openings 55 are formed corresponding to the dots 53 for marking in FIGS. 13A and 13B (see FIG. 14A). Each opening 55 is formed at a limited photolithographic resolution, for example. The photoresist 43 includes a plurality of corner edges which are rounded in the chip formation region seen from the top thereof.

In step 9, with the protection tape remaining unremoved, the wafer 1 is etched in a similar manner to the above-mentioned step 8 described with reference to FIG. 8J. As a result, a trimming opening (not shown) is formed, followed by selective removal of the wafer 1 in the isolation region to the opening 47 so that the wafer 1 is isolated into each chip 4. The back surface 1b of the wafer 1 to the opening 55 has a plurality of dots 53 including recesses formed thereon. Since the opening 55 formed in the wafer 1 is smaller than the opening 47, the opening 55 has a slower etch rate than the opening 47. As a result, the dots 53 do not penetrate into the wafer 1.

In step 10, the photoresist 43 is removed by the asher.

Based on the result of the wafer test in step 6 described with reference to FIG. 8E, laser light is irradiated using the IR aligner onto a predetermined fuse element to perform a trimming process. At this time, the laser marking may be performed over regions other than the trimming opening (not shown) and the dots 53 on the back surface 1b.

Figure 14A:
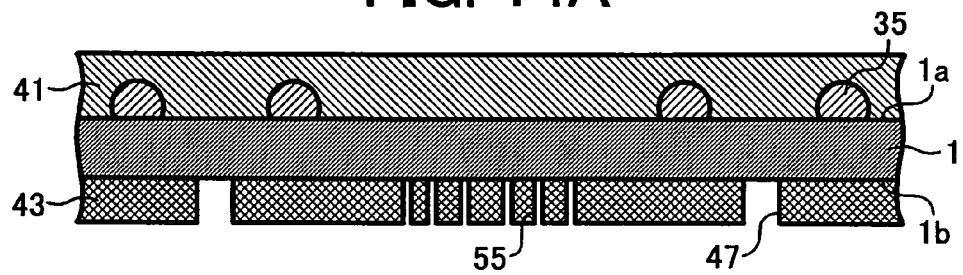
FIGS. 14A–14D are cross-sectional views illustrating examples of manufacturing processes of a semiconductor device of the present invention.
Figure 14B:
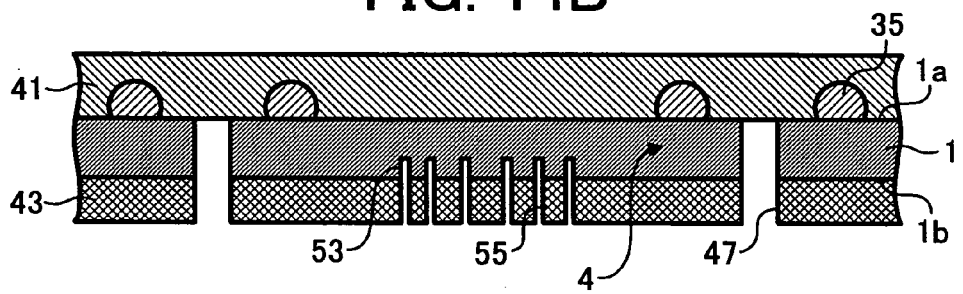
Figure 14C:
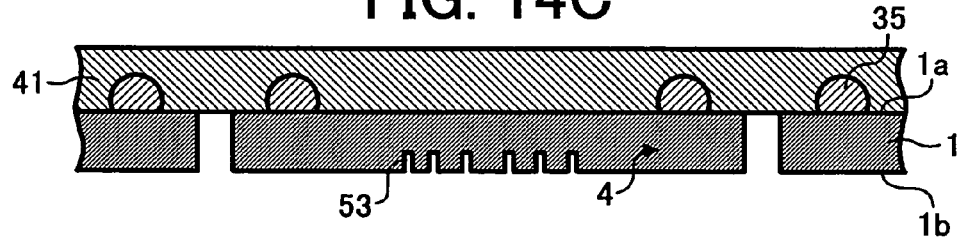
Figure 14D:
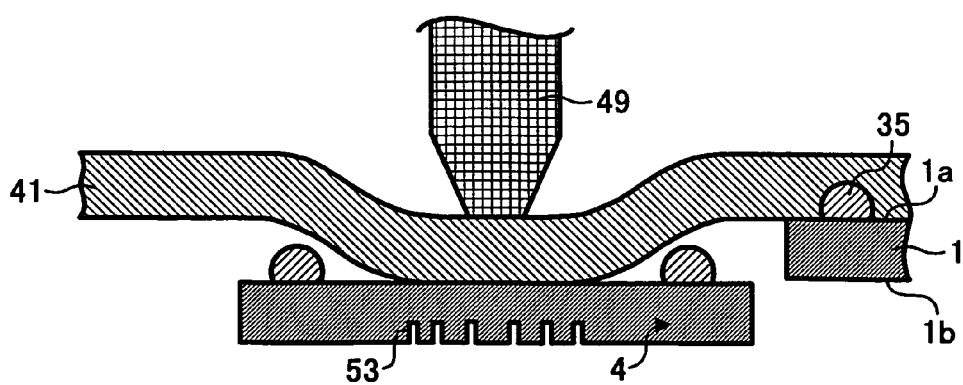

After laser trimming, the trimming opening of the wafer 1 is filled with a sealing resin (not shown)(see FIG. 14C).

In step 11, ultraviolet light is irradiated onto the surface 1a of the wafer 1 with an ultraviolet radiation device to decrease an adhesion of the surface protection tape 41. The individual chip 4 is pushed with the pickup needle 49 before removing (see FIG. 14D).

Thus, the photoresist 43 including the opening 55 for forming markings in the chip 4 formation region is masked to form the trimming opening and cut the chip 4. Simultaneously with forming the trimming opening and cutting the chip 4, information about a manufacturing lot and a type of device is imprinted into the markings formed by the dots 53 so that a marking imprint step is eliminated.

Figure 15A:
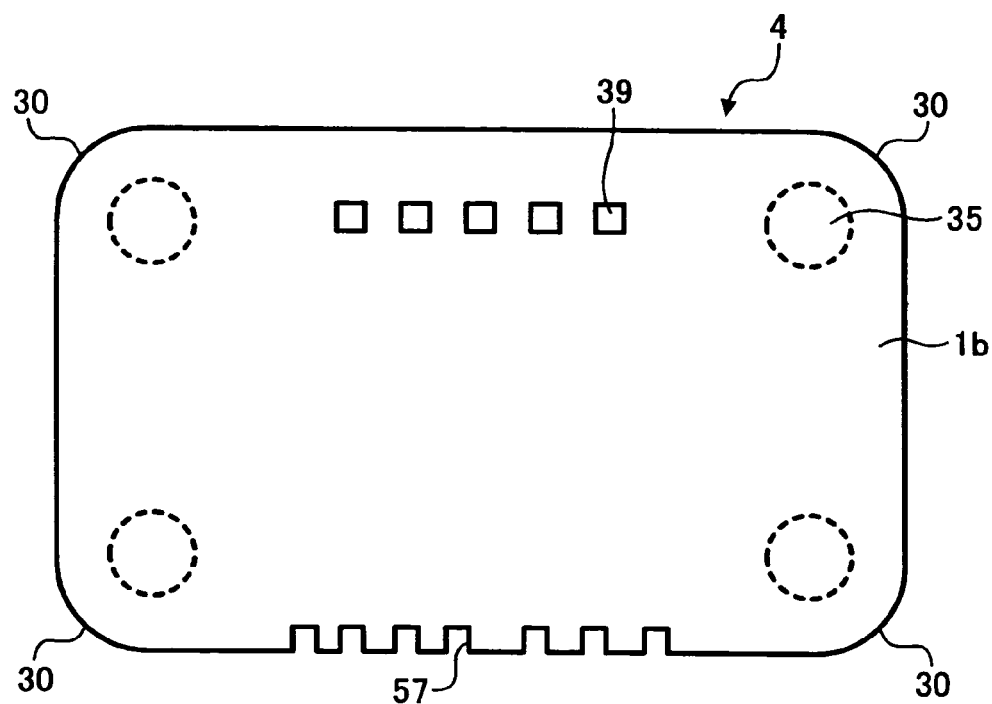
FIG. 15A is a plan view of a semiconductor substrate according to another embodiment of the present invention.
Figure 15B:
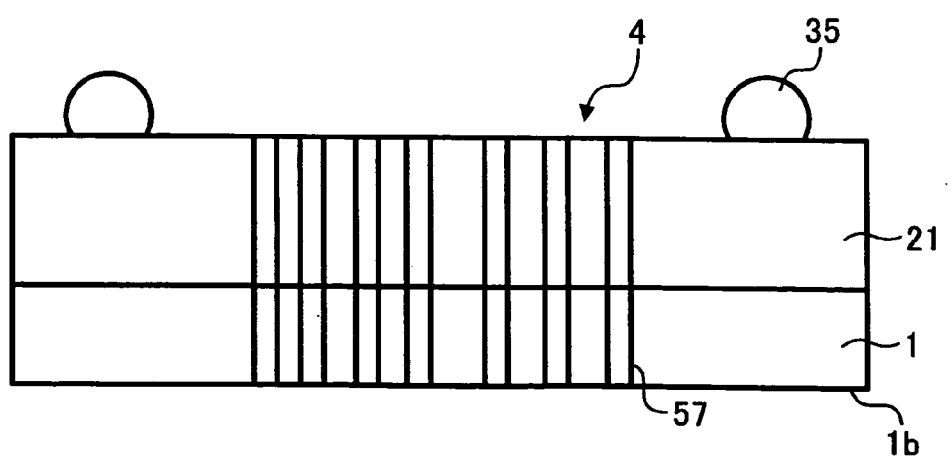
FIG. 15B is a side view of the semiconductor substrate shown in FIG. 15A.

FIG. 15A is a plan view of a semiconductor device according to another embodiment of the present invention. FIG. 15B is a side view of the semiconductor device shown in FIG. 15A. The same reference numerals have been used to identify components which provide the same functions as those in the embodiments of FIGS. 6A–6B and 12A–12B and will not be further explained.

The chip 4 includes a side surface on which predetermined pits and dents present a bar code 57. The bar code 57 includes information about a manufacturing lot and a type of device.

A manufacturing method for fabricating the chip shown in FIGS. 15A and 15B is substantially similar to the embodiment described with reference to FIGS. 7 to 8A–8M. One exception is that the bar code 57 having pits and dents is formed in the photoresist 43 in addition to the openings 45 and 47 in step 8 described with reference to FIG. 8I. Subsequently, the photoresist 43 with pits and dents corresponding to the bar code 57 is masked to selectively remove the wafer 1 so that the bar code 57 is formed on a side surface of the chip 4 simultaneously with forming the trimming opening and cutting the chip 4.

In the laser trimming processing step of the above-mentioned step 9 described with reference to Step S9 in FIG. 7, laser marking may be performed on the back surface 1b of the wafer 1 for identifying the chip 4.

Figure 16A:
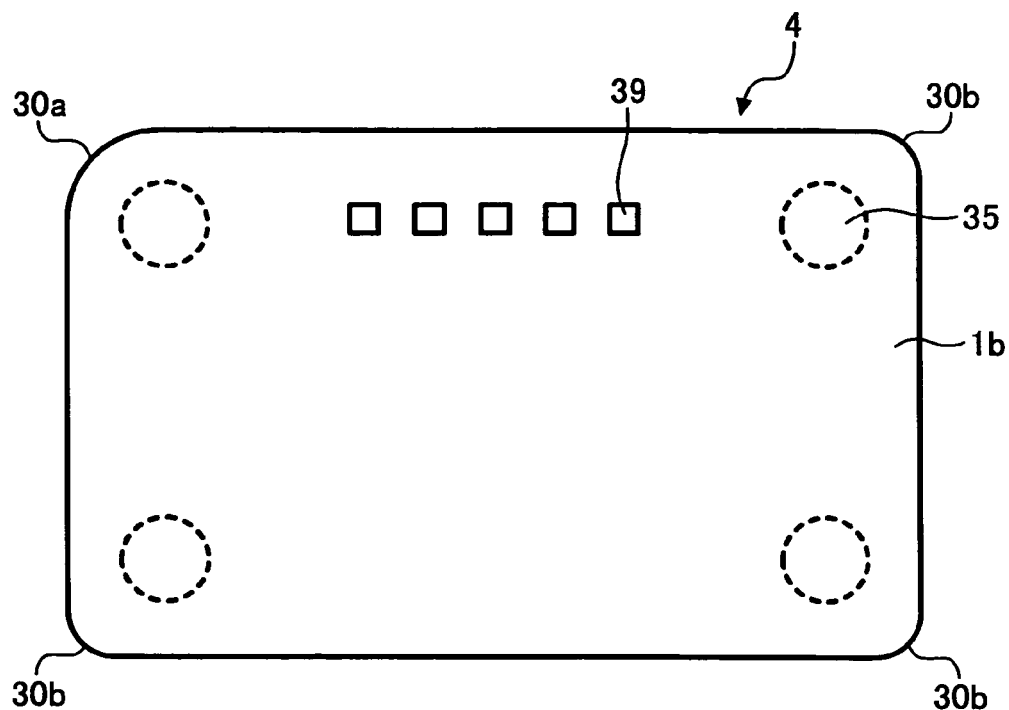
FIG. 16A is a plan view of a semiconductor substrate according to another embodiment of the present invention.
Figure 16B:
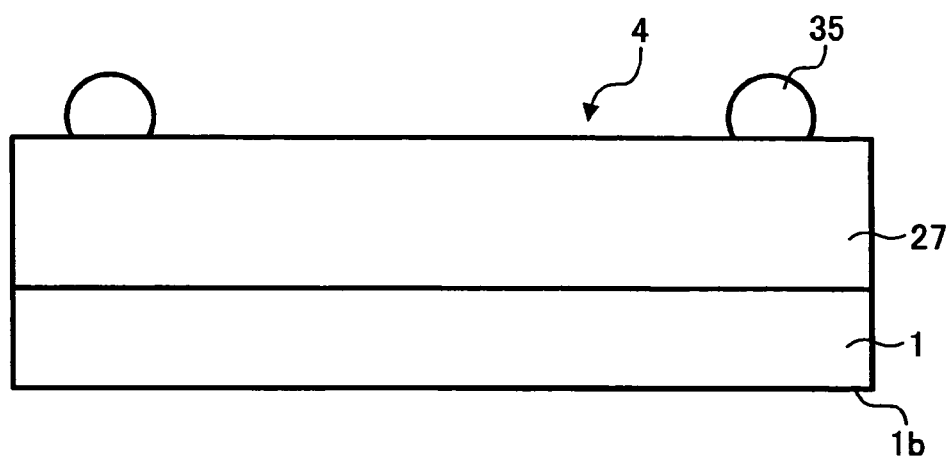
FIG. 16B is a side view of a semiconductor substrate shown in FIG. 16A.

FIG. 16A is a plan view of a semiconductor substrate according to another embodiment of the present invention. FIG. 16B is a side view of the semiconductor substrate shown in FIG. 16A. The same reference numerals have been used to identify components which provide the same functions as those in the embodiments of FIGS. 6A, 6B, 12A, and 12B and will not be further explained.

A corner edge 30a has a curvature greater than other corner edges 30b. The edge 30a is disposed nearest to a first pin of the external contact terminal 35. Therefore, the first pin is identified from the difference between corner edges 30a and 30b.

A manufacturing method for fabricating the chip shown in FIGS. 16A and 16B is substantially similar to the embodiment described with reference to FIGS. 7 to 8A–8M. One exception is that, in the step 8 described with reference to FIG. 8I, the opening 47 is formed such that the photoresist 43 corresponding to the corner edge 30a has a curvature greater than the photoresist 43 corresponding to the corner edges 30b when the openings 45 and 47 are formed in the photoresist 43. Thereafter, the resultant photoresist 43 is masked to selectively remove the wafer 1. Simultaneously with forming the trimming opening 37 and cutting the chip 4, the chip 4 is formed such that the corner edge 30a has a curvature greater than other corner edges 30b.

In addition, in the laser trimming processing step of the above-mentioned step 9 described with reference to Step S9 in FIG. 7, laser marking may be performed on the back surface 1b of the wafer 1 for identifying the chip 4.

Semiconductor devices to which the present invention is applied include a chip size package (CSP). The CSP is a package which has a size approximately equal to or slightly larger than a chip for higher device density.

In the above-mentioned embodiment, the semiconductor device of the present invention is applied to a wafer level CSP. However, it is understood that the invention is not limited in this respect. The present invention is applied to any semiconductor devices having a fuse element through an insulating film on a main surface of a semiconductor substrate.

Further, in this embodiment, the trimming opening 37 is filled with the sealing resin 39. However, it is understood that the invention is not limited in this respect. Alternatively, an insulating film is formed on the back surface 1b of the semiconductor substrate 1 to seal the trimming opening 37, for example.

Moreover, the present invention is also applied to a semiconductor device having an analog circuit configured to regulate electrical characteristics with laser trimming. Examples of such devices are semiconductor devices having a constant voltage circuit or a voltage detecting circuit.

Figure 17:
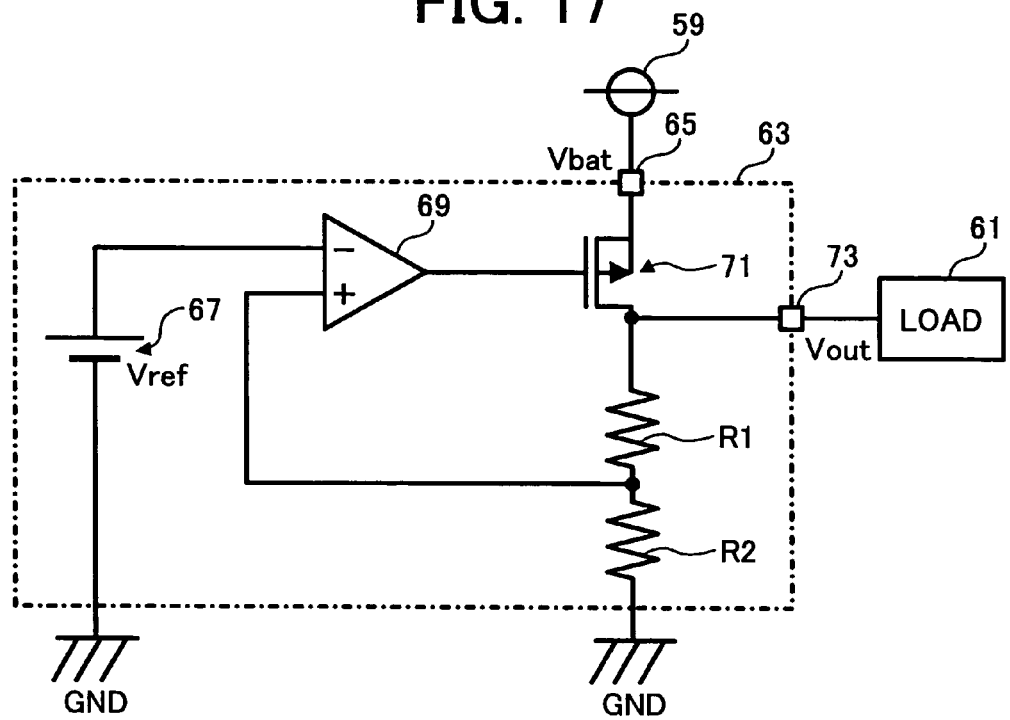
FIG. 17 is a circuit diagram of an exemplary semiconductor device including a constant voltage circuit according to the present invention.

FIG. 17 is a circuit diagram of an exemplary semiconductor device including a constant voltage circuit according to the present invention.

A constant voltage circuit 63 is provided to stably supply voltage from a direct current power source 59 to a load 61. The constant voltage circuit 63 includes an input terminal (Vbat) 65, a reference voltage generating circuit (Vref) 67, an operational amplifier 69, a P-channel MOS transistor 71 (hereinafter referred to as PMOS), voltage divider resistors R1 and R2, and an output terminal (Vout) 73. The input terminal 65 is connected to the direct current power source 59. The PMOS 71 includes an output driver.

In the operational amplifier 69 in the constant voltage circuit 63, an output terminal is connected to a gate electrode of the PMOS 71, a reference voltage Vref is applied to an inverting input terminal from the reference voltage generating circuit 67, and an output voltage Vout divided by resistors R1 and R2 is applied to a non-inverting input terminal. As a result, the output voltage Vout, divided by the resistors R1 and R2, is controlled to be equal to the reference voltage Vref.

Figure 18:
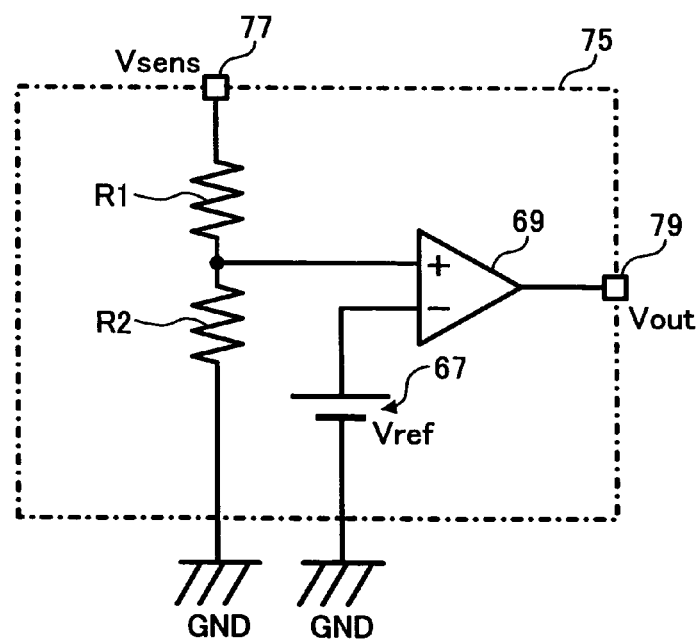
FIG. 18 is a circuit diagram of an exemplary semiconductor device including a voltage detecting circuit according to the present invention.

FIG. 18 is a circuit diagram of an exemplary semiconductor device including a voltage detecting circuit 75 according to the present invention.

The reference voltage generating circuit 67 is connected to an inverting input terminal of the operational amplifier 69 and is applied by the reference voltage Vref. A voltage input from an input terminal (Vsens) 77 is measured and then divided by the resistors R1 and R2, followed by input to a non-inverting input terminal of the operational amplifier 69. An output of the operational amplifier 69 is delivered outside through an output terminal 79.

In the voltage detecting circuit 75, when a terminal voltage to be measured is high and a voltage divided by the resistors R1 and R2 is higher than a reference voltage Vref, the output of the operational amplifier 69 is maintained at a high level. When a terminal voltage to be measured is low and a voltage divided by the resistors R1 and R2 is lower than a reference voltage Vref, the output of the operational amplifier 69 is maintained at a low level.

Generally, in the reference voltage generating circuit 63 shown in FIG. 17 and the voltage detecting circuit 75 shown in FIG. 18, a reference voltage Vref generated from a reference voltage generating circuit 67 deviates from specifications due to variations in a manufacturing process. In order to accommodate variations in the process, a resistor value is regulated with a resistor divider circuit. The resistor divider circuit regulates a resistor value by cutting a fuse element as a resistor divider.

Figure 19:
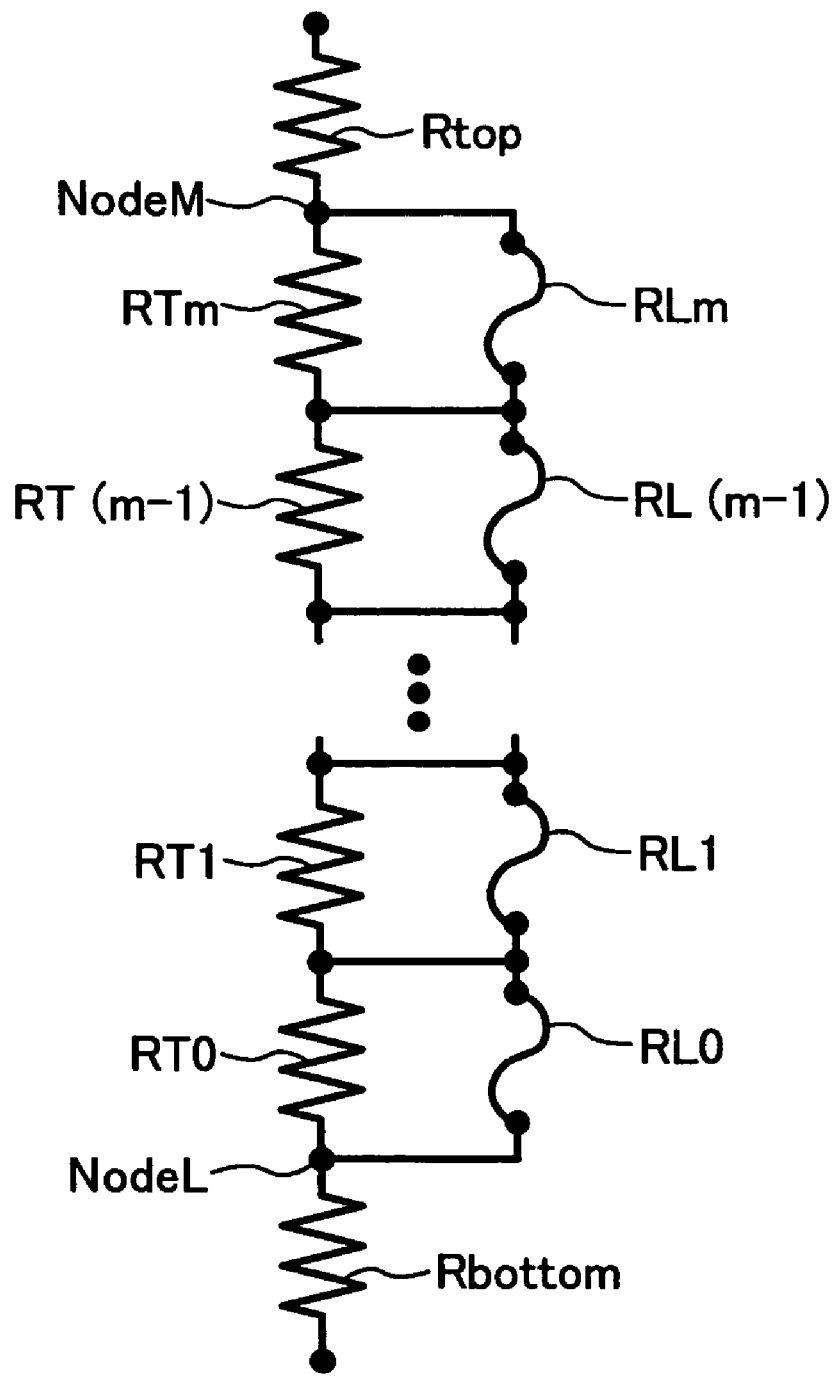
FIG. 19 is a circuit diagram illustrating an exemplary resistor divider circuit to which the fuse element and the trimming opening according to the present invention are applied.
Figure 20:
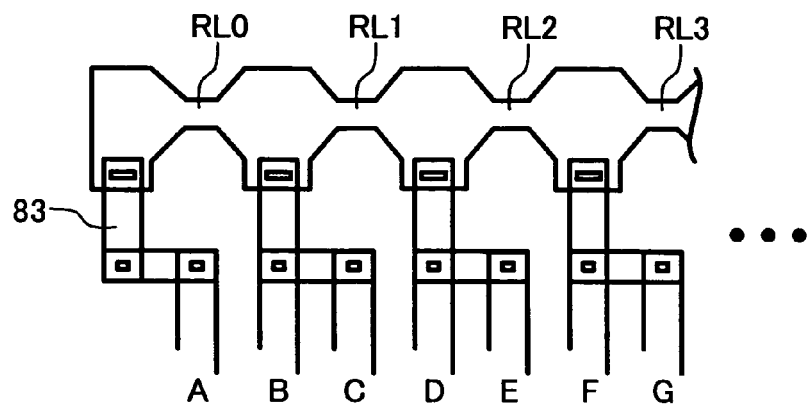
FIG. 20 is a layout diagram illustrating an exemplary fuse element of the resistor divider circuit.
Figure 21:
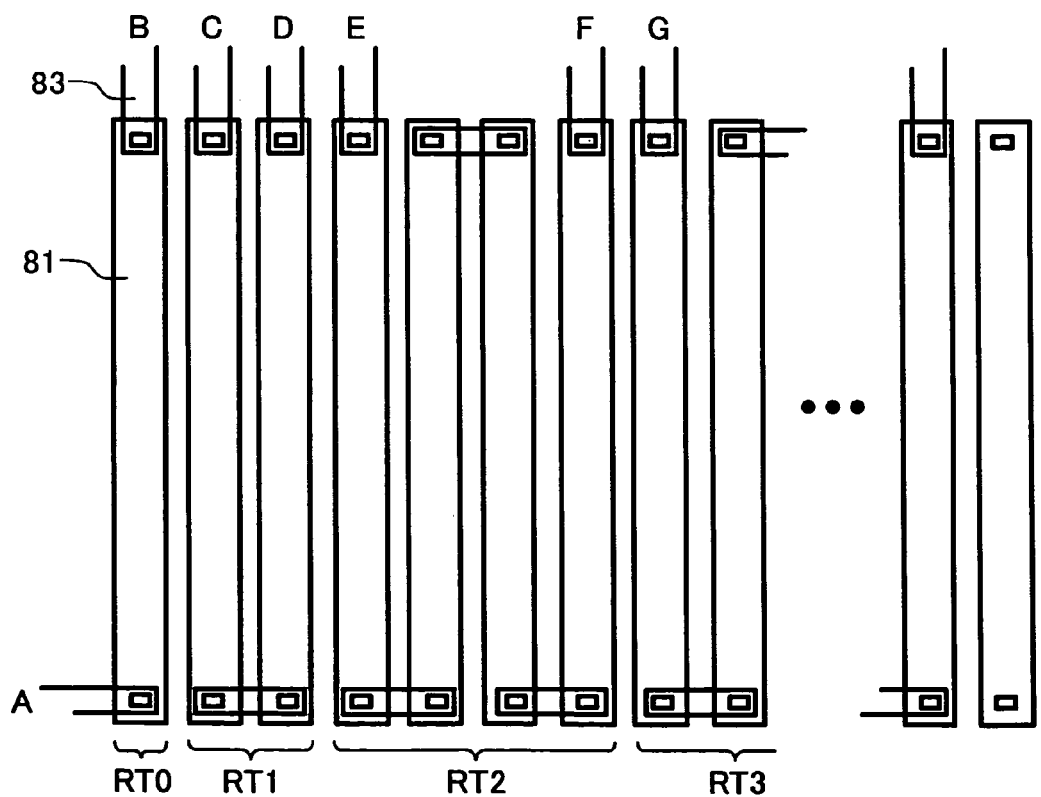
FIG. 21 is a layout diagram illustrating an exemplary predetermined fuse element of a resistor divider circuit.

FIG. 19 is a circuit diagram illustrating an exemplary resistor divider circuit to which the fuse element and the trimming opening according to the present invention are applied. FIG. 20 is a layout diagram illustrating an exemplary fuse element of the resistor divider circuit of FIG. 19. FIG. 21 is a layout diagram illustrating an exemplary predetermined fuse element of a resistor divider circuit.

As shown in FIG. 19, a fuse element Rbottom, m+1 set resistance elements RT0, RT1, ..., RTm (i.e., m is a positive integer), and a resistance element Rtop are connected in series respectively. The resistance elements RT0, RT1, ..., RTm are connected in parallel to fuse elements RL0, RL1, ..., RLm, respectively.

As shown in FIG. 20, the fuse elements RL0, RL1, ..., RLm include polysilicon films, e.g., having a resistance of 20Ω to 40Ω. These fuse elements correspond to the fuse element 7 shown in FIGS. 6A and 6B. The trimming opening 37 (not shown in FIG. 19) is formed on the semiconductor substrate 1 corresponding to a formation region of each fuse element.

Values of the resistance elements RT0, RT1, ..., RTm are set to increase by a factor of 2 sequentially from Rbottom to Rtop. That is, the value of the resistance element RTm is equal to $2^n$ of a value of unity, where the value of unity is RT0.

For example, as shown in FIG. 21, a plurality of silicon patterns 81 include the same material in the same direction with the same size. In the resistance element RT0, one silicon pattern 81 is assigned a value of unity. The resistance element RTm includes $2^n$ units of silicon pattern 81. The silicon patterns 81, into which a P-type impurity or an N-type impurity is implanted, include a high-resistance polysilicon film having a sheet resistance of approximately 100Ω to 10 kΩ.

In FIGS. 20 and 21, each silicon pattern 81 shown in FIG. 21 electrically connects correspondingly to FIG. 20 across a space between A and A, B and B, C and C, D and D, E and E, F and F, and G and G by the metal wiring 83, respectively. The metal wirings 83 includes alloy, e.g., 98.5% aluminum, 1% silicon, and 0.5% copper. The metal wirings 83 have a sheet resistance of approximately 0.04Ω to 0.1Ω.

Thus, emphasis has been placed upon accuracy in ratio of a pair of resistors in a resistor divider circuit. The resistor divider circuit is designed in the form of a ladder such that unit resistances, each having a pair of a resistance element and a fuse element, are connected in series. This is possible due to increasing fabrication accuracy in a manufacturing process according to the present invention.

In such a resistor divider circuit, the fuse elements RL0, RL1, ..., RLm are cut by laser beam to provide a desired direct resistance.

When the resistor divider circuit shown in FIG. 19 is applied to the resistors R1 and R2 of the constant voltage circuit shown in FIG. 17, the resistance element Rbottom end is connected to ground and the resistance element Rtop end is connected to a drain of the PMOS 71, for example. In addition, a terminal NodeL between the resistance elements Rbottom and RT0, or a terminal NodeM between the resistance elements Rtop and RTm, is connected to a non-inverting input terminal of the operational amplifier 69.

When the resistor divider circuit shown in FIG. 19 is applied to the resistors R1 and R2 of the voltage detecting circuit shown in FIG. 18, the resistance element Rbottom end is connected to ground and the resistance element Rtop end is connected to the input terminal 77, for example. In addition, the terminal NodeL between the resistance elements Rbottom and RT0, or the terminal NodeM between the resistance elements Rtop and RTm, is connected to the non-inverting input terminal of the operational amplifier 69.

In the resistor divider circuit to which the fuse element and the trimming opening according to the present invention are applied, laser trimming is performed after an assembly process so that the conventional assembly process is not performed after the trimming process. This increases an output voltage accuracy of the resistor divider circuit. In addition, when trimming is performed to meet the customers' requirements, the time from receipt of orders to delivery is reduced.

Further, since the constant voltage circuit 63 shown in FIG. 17 includes the resistor divider circuit to which the fuse element and the trimming opening according to the present invention are applied, an output voltage accuracy of the resistors R1 and R2 included in the resistor divider circuit is improved. This stabilizes the output voltage of the constant voltage circuit 63.

Further, since the voltage detecting circuit 75 shown in FIG. 18 includes the resistor divider circuit to which the fuse element and the trimming opening according to the present invention are applied, an output voltage accuracy of the resistors R1 and R2 included in the resistor divider circuit is improved. This stabilizes the output voltage of the voltage detecting circuit 75.

However, the semiconductor device including the resistor divider circuit to which the fuse element and the trimming opening according to the present invention is applied are not limited to the semiconductor devices including the constant voltage circuit and the voltage detecting circuit. The present invention may be applied to any semiconductor devices including a resistor divider circuit.

Moreover, the semiconductor device including the resistor divider circuit to which the fuse element and the trimming opening according to the present invention are applied is not limited to the semiconductor device including a resistor divider circuit. The present invention may be applied to any semiconductor devices including the fuse element and the trimming opening.

Numerous additional modifications and variations are possible in light of the above teachings. It is therefore to be understood that within the scope of the appended claims, the disclosure of this patent specification may be practiced otherwise than as specifically described herein.

What is claimed as new and desired to be protected by Letters Patent of the United States is:

1. A semiconductor device, comprising:
   a semiconductor substrate including main and back surfaces and a trimming opening penetrating through the semiconductor substrate from the back surface to the main surface;
   an insulating film formed on the main surface of the semiconductor substrate; and
   a fuse element disposed opposite the main surface of the semiconductor substrate on the insulating film at a position aligned with and electrically isolated from the trimming opening.

2. The semiconductor device as defined in claim 1, wherein the insulating film remains intact between the fuse element and the trimming opening until a process of cutting the fuse element is performed whereby the insulating film is penetrated.

3. The semiconductor device as defined in claim 1, further comprising an non-conductive material filled into the trimming opening such that the trimming opening is sealed to prevent contamination of the fuse element from the back surface of the semiconductor substrate.

4. The semiconductor device as defined in claim 1, wherein the semiconductor device has a contour with a plurality of corner edges which are rounded.

5. The semiconductor device as defined in claim 4, wherein one of the plurality of corner edges has a curvature greater than those of others of the plurality of corner edges.

6. The semiconductor device as defined in claim 4, wherein the contour of the semiconductor device has a side surface on which predetermined pits and dents representing a bar code are formed.

7. The semiconductor device as defined in claim 1, wherein the back surface of the semiconductor substrate comprises at least one recess-shaped marking formed thereon.

8. The semiconductor device as defined in claim 1, wherein the back surface of the semiconductor substrate comprises a marking formed thereon by laser irradiation.

9. A semiconductor device, comprising:
a semiconductor substrate having first and second surfaces, the semiconductor substrate defining at least one opening penetrating through the semiconductor substrate and the first and second surfaces;
a film of insulating material disposed on the second surface of the semiconductor substrate; and
a fuse element corresponding to each opening disposed on the film of insulating material at a side opposite to and isolated from the semiconductor substrate, a trimmable portion of the fuse aligned with the respective opening.

10. The semiconductor device as defined in claim 9, wherein the insulating film remains intact between the fuse element and the trimming opening until a process of cutting the fuse element is performed whereby the insulating film is penetrated.

11. The semiconductor device as defined in claim 9, further comprising a non-conductive material filled into the trimming opening such that the trimming opening is sealed from the back surface of the semiconductor substrate to prevent contamination of the fuse element.

12. The semiconductor device as defined in claim 9, wherein the semiconductor device has a contour with a plurality of corner edges which are rounded.

13. The semiconductor device as defined in claim 12, wherein one of the plurality of corner edges has a curvature greater than those of others of the plurality of corner edges.

14. The semiconductor device as defined in claim 12, wherein the contour of the semiconductor device has a side surface on which predetermined pits and dents representing a bar code are formed.

15. The semiconductor device as defined in claim 9, wherein the back surface of the semiconductor substrate comprises at least one recess-shaped marking formed thereon.

16. The semiconductor device as defined in claim 9, wherein the back surface of the semiconductor substrate comprises a marking formed thereon by laser irradiation.

* * * * *